(12) United States Patent
Binnad et al.

(10) Patent No.: US 9,030,057 B2
(45) Date of Patent: May 12, 2015

(54) METHOD AND APPARATUS TO ALLOW A PLURALITY OF STAGES TO OPERATE IN CLOSE PROXIMITY

(75) Inventors: Michael B. Binnad, Belmont, CA (US); Pai-Hsueh Yang, Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 205 days.

(21) Appl. No.: 13/526,994

(22) Filed: Jun. 19, 2012

(65) Prior Publication Data

US 2012/0328836 A1    Dec. 27, 2012

Related U.S. Application Data

(60) Provisional application No. 61/500,714, filed on Jun. 24, 2011.

(51) Int. Cl.
*H02K 41/02*  (2006.01)
*G03F 7/20*  (2006.01)
*H02K 41/03*  (2006.01)
*H02K 3/47*  (2006.01)

(52) U.S. Cl.
CPC .......... *G03F 7/70758* (2013.01); *H02K 41/031* (2013.01); *H02K 3/47* (2013.01); *H02K 2201/18* (2013.01)

(58) Field of Classification Search
CPC .............................. H02K 41/02; H02K 41/00
USPC ............................................. 310/12.05, 12.06
See application file for complete search history.

(56) References Cited

U.S. PATENT DOCUMENTS

| | | | | |
|---|---|---|---|---|
| 6,097,114 A | * | 8/2000 | Hazelton | 310/12.06 |
| 6,445,093 B1 | * | 9/2002 | Binnard | 310/12.06 |
| 6,452,292 B1 | | 9/2002 | Binnard | |
| 6,531,793 B1 | * | 3/2003 | Frissen et al. | 310/12.06 |
| 6,590,355 B1 | * | 7/2003 | Kikuchi et al. | 310/12.06 |
| 2006/0049697 A1 | | 3/2006 | Binnard | |
| 2010/0238425 A1 | | 9/2010 | Binnard | |

* cited by examiner

Primary Examiner — Michael Andrews

(57) ABSTRACT

According to one aspect of the present invention, a stage apparatus includes a first stage, a first magnet arrangement, and a stator arrangement that includes a first coil having a first width. The first magnet arrangement is associated with the first stage, and includes a first quadrant and a second quadrant or, more generally, a first sub-array and a second sub-array. The first quadrant has at least one first magnet arranged parallel to a first axis, and the second quadrant has at least one second magnet arranged parallel to a second axis. The first quadrant is adjacent to the second quadrant relative to the first axis, and is spaced apart from the second quadrant by a distance relative to the second axis. The stator arrangement is configured to cooperate with the first magnet arrangement to drive the first stage.

12 Claims, 24 Drawing Sheets

METHOD AND APPARATUS TO ALLOW A PLURALITY OF STAGES TO OPERATE IN CLOSE PROXIMITY

CROSS REFERENCE TO RELATED APPLICATION

The present applications claim benefit under 35 U.S.C. §119(e) of U.S. Provisional Patent Application No. 61/500,714, entitled "Moving Magnet Planar Motor Layout to Allow Two Stages to Operate Close Together," filed Jun. 24, 2011, which is incorporated herein by reference in its entirety.

BACKGROUND OF THE INVENTION

1. Field of the Invention

The present invention relates generally to equipment used in semiconductor processing. More particularly, the present invention relates to a configuration for magnets and/or coils of a planar motor that allows two stages of an overall stage apparatus to operate close together.

2. Description of the Related Art

Many stage apparatus include stages which would benefit from operating in close proximity to each other. For example, in a lithography system such as an immersion lithography system, the ability for two stages, as for example two wafer stages or a wafer stage and a measurement stage, to operate in close proximity to each other enhances the performance of the system.

Stages that are part of a lithography system, e.g., moving magnet stages, generally utilize linear or planar motors to drive the stages. A linear or planar motor typically includes a mover and a stator, one of which contains an array of coils and the other of which contains an array of permanent magnets. "Moving coil" generally refers to motors where the mover contains the coil array and the stator contains the magnet array. "Moving magnet" generally refers to motors where the stator contains the coil array and the mover contains the magnet array. In a stage driven by a moving magnet planar motor, magnets mounted on the stage may be oriented such that some magnets, e.g., X magnets, of a substantially continuous array are oriented to create a force in at least an X direction, and other magnets, e.g., Y magnets, of the array are oriented to create a force in at least a Y direction. A stator may include some coils oriented to produce force in at least an X direction, e.g., X coils, and other coils oriented to produce force in at least a Y direction, e.g., Y coils. The magnets and the stator are generally effective in generating desired forces, e.g., a desired force in an X direction may be generated when an appropriate X magnet interacts with an X coil, additional forces, normally of a smaller magnitude, that are not desired may also be generated.

When two stages of a lithography system are relatively close to one another, while a desired force may be generated to drive one stage, undesired forces may also be generated that have an adverse effect on the other stage. In other words, when two stages are driven by a moving magnet planar motor system, in generating a desired force to drive one stage, disturbance forces that have a relatively significant adverse effect on the other stage may be created. To avoid generating such disturbance forces, the two stages may be spaced further apart, thereby impacting the ability for the two stages to operate close together.

SUMMARY

The present invention pertains to a moving magnet planar motor arrangement that includes stacked coils and/or magnet arrays that include quadrants of magnets which are spaced apart. Such a moving magnet planar motor arrangement allows two stages to operate relatively close together in a lithography system such as an immersion lithography system. It should be appreciated that spacing quadrants of magnets apart on a stage may be beneficial to facilitate the accurate control of a substantially single stage.

According to one aspect of the present invention, a stage apparatus includes a first stage, a first magnet array, and a stator arrangement. The first magnet array is associated with the first stage. The stator arrangement cooperates with the first magnet array to drive the first stage, and includes a plurality of coils. The plurality of coils includes a first coil of a first type and a second coil of a second type where the first coil is stacked over the second coil, and a third coil of the first type and a fourth coil of the second type where the fourth coil is stacked over the third coil The first and fourth coils are in a first plane, and the second and third coils are in a second plane In one embodiment, the first coil is stacked over the second coil and supports a force in a first direction along a first axis while the second coil supports a force in a second direction along a second axis.

In accordance with another aspect of the present invention, a stage apparatus includes a first stage, a first magnet arrangement, and a stator arrangement that includes a first coil having a first width. The first magnet arrangement is associated with the first stage, and includes a first quadrant and a second quadrant or, more generally, a first sub-array and a second sub-array. The first quadrant has at least one first magnet arranged parallel to a first axis, and the second quadrant has at least one second magnet arranged parallel to a second axis. The first quadrant is adjacent to the second quadrant relative to the first axis, and is spaced apart from the second quadrant by a distance relative to the second axis. The stator arrangement is configured to cooperate with the first magnet arrangement to drive the first stage. In one embodiment, the first magnet arrangement is a linear magnet array, and the first quadrant is arranged to cooperate with the stator arrangement to generate a first force along the second axis while the second quadrant is arranged to cooperate with the stator arrangement to generate a second force along the first axis.

According to yet another aspect of the present invention, a stage apparatus includes a first stage, a second stage, a first magnet array, a second magnet array, and a stator arrangement. The first magnet array is associated with the first stage, and includes a first quadrant having at least one first magnet and a second quadrant having at least one second magnet. The first quadrant is arranged to produce a force in a first direction and the second quadrant is arranged to produce a force in a second direction. The second magnet array is associated with the second stage, and includes a third quadrant having at least one third magnet and fourth quadrant having at least one fourth magnet. The third quadrant is arranged to produce a force in the first direction, while the fourth quadrant is arranged to produce a force in the second direction. The stator arrangement includes at least one coil, and cooperates with the first magnet array to drive the first stage as well as with the second magnet array to drive the second stage. When the fourth quadrant is approximately adjacent to the first quadrant, the second stage may move in closer proximity to the first stage than when the third quadrant is approximately adjacent to the first quadrant.

BRIEF DESCRIPTION OF THE DRAWINGS

The invention will be readily understood by the following detailed description in conjunction with the accompanying drawings, in which.

DETAILED DESCRIPTION OF THE EMBODIMENTS

Example embodiments are discussed below with reference to the various figures. However, those skilled in the art will readily appreciate that the detailed description given herein with respect to these figures is for explanatory purposes, as the invention extends beyond these embodiments.

A stage that includes a magnet array with sub-arrays, e.g., quadrants, that are spaced apart in one direction, e.g., an X direction or a Y direction, effectively ensures that coil groups that are part of a stator arrangement which cooperates with the magnet array to drive the stage will make a relatively strong force with magnets in substantially only one quadrant at any given time. In other words, spacing between quadrants of a magnet array effectively prevents a coil from producing a substantial force with more than one quadrant at a time. It should be appreciated that although quadrants of magnets are described for ease of discussion, magnets are not limited to being divided into four quadrants and may generally be divided into any number of sub-arrays.

Within an overall stage system that utilizes more than one stage, as for example within an immersion lithography system in which a wafer stage may move together with a measurement stage having various sensors or measurement tools and/or a tube carrier stage supporting tubes or pipes connected to the wafer stage, or in a system in which two wafer stages periodically move together, arranging magnet arrays associated with the stages such that a quadrant of one stage that has a particular magnetic orientation is approximately adjacent to a quadrant of a second stage that has a substantially perpendicular magnetic orientation allows the two stages to operate in close proximity. For example, positioning a quadrant of magnets of a wafer stage that are arranged to make a force in an X direction, i.e., an "X quadrant," approximately adjacent to a quadrant of magnets of a measurement stage, a tube carrier stage, or another wafer stage that are arranged to make force in a Y direction, i.e., a "Y quadrant," allows the two stages to operate in relatively close proximity because energized X coils that overlap both stages will make a substantial force with the X quadrant of the first stage, but will not interact strongly with the Y quadrant of the second stage. Similarly, energized Y coils that overlap both stages will make a substantial force with the Y quadrant of the second stage, but will not interact strongly with the X quadrant of the first stage.

In one embodiment, a stator that is a part of a planar motor may include a stacked coil arrangement. A stacked coil arrangement is a configuration of coils in which a substantially uniform layer of X coils may be stacked on top of a substantially uniform layer of Y coils, and/or vice versa. The stacking of coils provides a stator within which substantially every location within the stator has an X coil and a Y coil.

Figure 1:
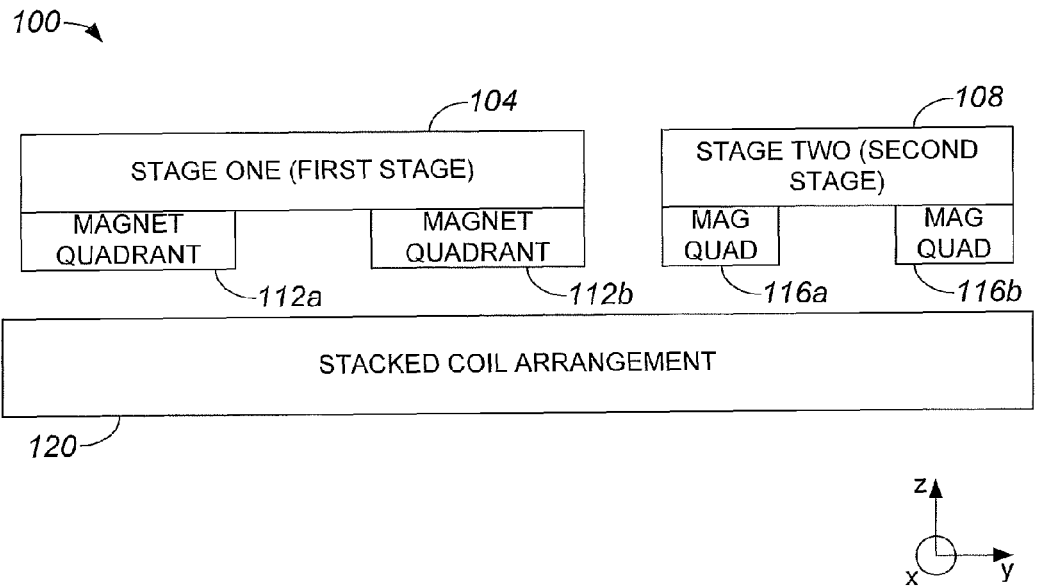
FIG. 1 is a diagrammatic representation of a stage arrangement which includes a planar motor having a stacked coil arrangement and magnet arrays with sub-arrays, e.g., quadrants, of magnets that are spaced apart in accordance with an embodiment of the present invention.

Referring initially to FIG. 1, a stage arrangement which includes a planar motor having a stacked coil arrangement and magnets arrays with quadrants of magnets that are spaced apart will be described in accordance with an embodiment of the present invention. It should be appreciated that although a stage arrangement 100 of FIG. 1 is shown as including a stacked coil arrangement and magnet arrays with quadrants of magnets that are spaced apart, stage arrangement 100 may instead include either a stacked coil arrangement or magnet arrays with quadrants of magnets that are spaced apart.

Stage arrangement 100 includes a first stage 104 and a second stage 108. In one embodiment, first stage 104 may be a wafer stage and second stage 108 may be a measurement stage, a tube carrier stage, or another wafer stage 108. In general, stage 108 may be any type of stage. Although stage 108 may be any type of stage, stage 108 will be referred to as a measurement stage for ease of discussion. Wafer stage 104 and measurement stage 108 are oriented above a stacked coil arrangement 120 which includes X coils (not shown), e.g., coils arranged to generate a force in an X direction and Y coils (not shown), e.g., coils arranged to generate a force in a Y direction, that are stacked with respect to a Z direction. It should be appreciated, however, that in some applications, a stage arrangement such as stage arrangement 100 may be oriented differently with relative to gravity, as for example upside down or vertically, e.g., with gravity acting in an X direction or a Y direction. Wafer stage 104 is coupled to a magnet array that includes magnet quadrants 112a, 112b arranged to cooperate with stacked coil arrangement 120 to operate as a planar motor to drive wafer stage 104. Measurement stage 108 is coupled to a magnet array that includes magnet quadrants 116a, 116b arranged to also cooperate with stacked coil arrangement 120 to operate as a planar motor to drive measurement stage 108.

As shown, magnet quadrant 112a is spaced apart along, or relative to, a y-axis from magnet quadrant 112b, and magnet quadrant 116a is spaced apart along the y-axis from magnet quadrant 116b. The amount by which magnet quadrant 112a is spaced apart from magnet quadrant 112b, and the amount by which magnet quadrant 116a is spaced apart from magnet quadrant 116b, may vary. In one embodiment, the amount by which magnet quadrant 112a is spaced apart from magnet quadrant 112b and the amount by which magnet quadrant 116a is spaced apart from magnet quadrant 116b may be greater than or approximately equal to a length of a coil (not shown) that is included in stacked coil arrangement 120 in a Y direction. It should be appreciated that in some embodiments, magnet quadrants may be spaced apart by the longer of a width or a length of a coil.

Figure 2A:
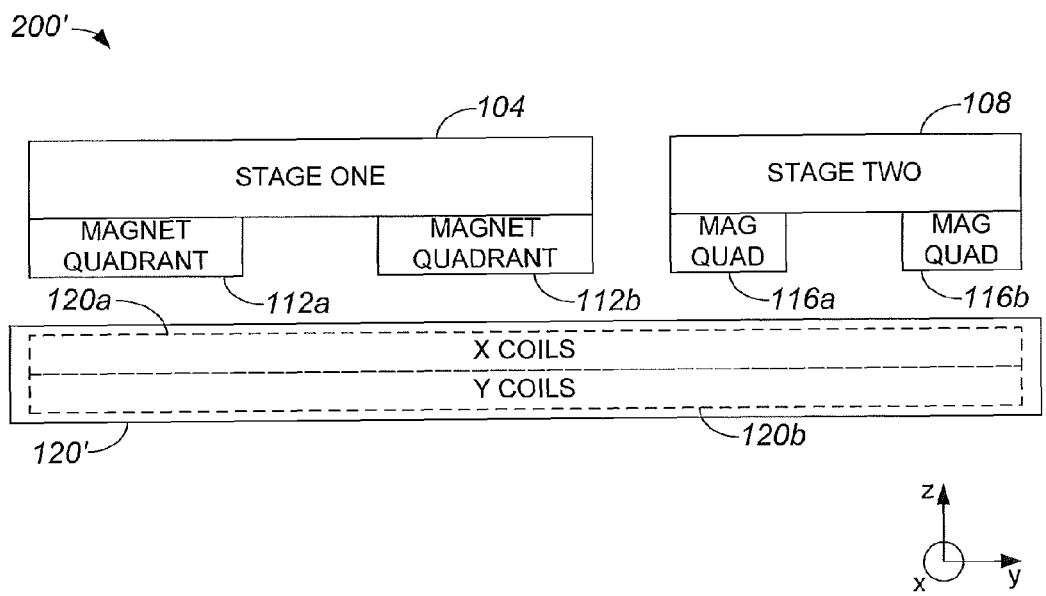
FIG. 2A is a diagrammatic representation of a stage arrangement which includes a planar motor having a stacked coil arrangement in which X coils are stacked on top of Y coils, and magnet arrays with quadrants of magnets that are spaced apart in accordance with an embodiment of the present invention.

Stacked coil arrangement 120 generally includes at least one X coil (not shown) arranged to cooperate with X magnets (not shown), or magnets included in magnet quadrants 112a, 112b, 116a, 116b which oriented to create a force in an X direction, and at least one Y coil arranged to cooperate with Y magnets (not shown), or magnets included in magnet quadrants 112a, 112b, 116a, 116b which are oriented to create a force in an Y direction. Stacked coil arrangement 120 preferably includes uniform layers of coils (not shown), and the uniform layer of coils may preferably be arranged in substantially rectangular or square groups of coils. In other words, stacked coil arrangement 120 is configured such that at substantially every location within stacked coil arrangement 120 along at least an x-axis, stacked coil arrangement 120 includes an X coil (not shown) and a Y coil (not shown). With respect to FIGS. 2A-C, different configurations of coils within a stacked coil arrangement, e.g., a stacked coil arrangement of a stator, will be described in accordance with an embodiment of the present invention. In one embodiment, as shown in FIG. 2A, within a stage arrangement 200' that includes a stacked coil arrangement 120', X coils 120a may be stacked on top of Y coils 120b. X coils 120a are stacked on top of Y coils 120b such that X coils 120a are closer to magnet quadrants 112a, 112b, 116a, 116b than Y coils 120b. When X coils 120a are closer to magnet quadrants 112a, 112b, 116a, 116b relative to a z-axis than Y coils 120b, X coils 120a typically operate with better efficiency than Y coils 120b.

When X coils 120a are stacked on top of Y coils 120b, X coils 120a are positioned substantially over Y coils 120b with respect to a z-axis. It should be appreciated that although X coils 120a may be in contact with Y coils 120b, X coils 120a may instead be positioned such that there is a slight gap between coils 120a and Y coils 120b with respect to a z-axis.

Figure 2B:
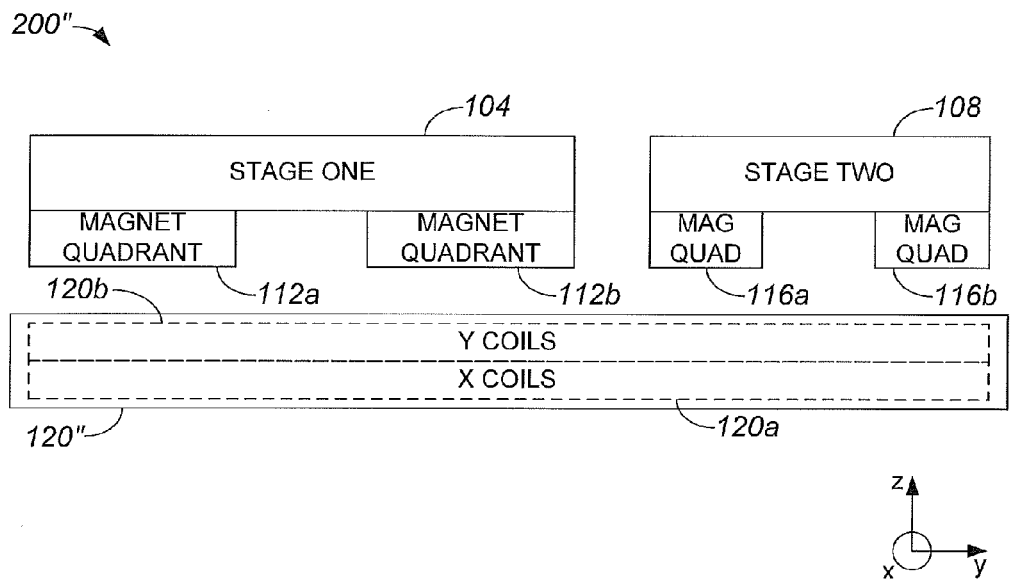
FIG. 2B is a diagrammatic representation of a stage arrangement which includes a planar motor having a stacked coil arrangement in which Y coils are stacked on top of X coils, and magnet arrays with quadrants of magnets that are spaced apart in accordance with an embodiment of the present invention.

When a system is such that efficiency associated with Y coils is more important than efficiency associated with X coils, Y coils may be stacked on top of X coils. FIG. 2B is a diagrammatic representation of a stage arrangement which includes a planar motor having a stacked coil arrangement in which Y coils are stacked on top of X coils in accordance with an embodiment. A stage arrangement 200" includes a stacked coil arrangement 120" that has Y coils 120b stacked on top of X coils 120a such that Y coils 120b are in closer proximity to magnet quadrants 112a, 112b, 116a, 116b than X coils 120a. Thus, Y coils 120b operate with better efficiency than X coils 120a due to coils 120b being closer to magnet quadrants 112a, 112b, 116a, 116b relative to a z-axis than X coils 120a.

Figure 2C:
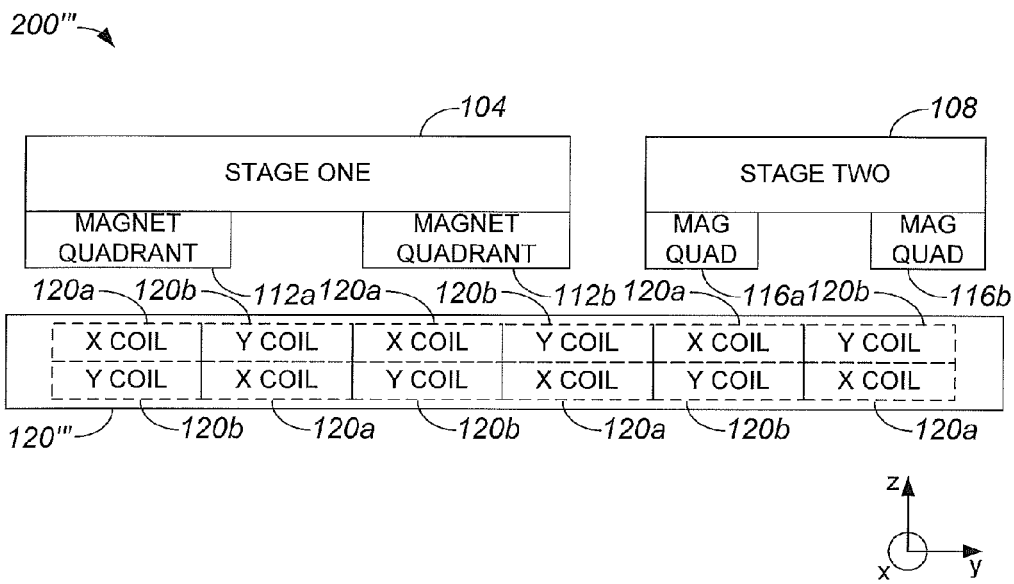
FIG. 2C is a diagrammatic representation of a stage arrangement which includes a planar motor having a stacked coil arrangement in which some X coils are stacked on top of some Y coils and other Y coils are stacked on top of X coils, and magnet arrays with quadrants of magnets that are spaced apart in accordance with an embodiment of the present invention.

In one embodiment, a stacked coil arrangement of a stator may be such that some areas of the stacked coil arrangement have X coils stacked on top of Y coils, while other areas of the stacked coil arrangement have Y coils stacked on top of X coils. FIG. 2C is a diagrammatic representation of a stage arrangement which includes a planar motor having a stacked coil arrangement in which some X coils are stacked on top of some Y coils and other Y coils are stacked on top of X coils in accordance with an embodiment. A stage arrangement 200''' includes a stacked coil arrangement 120''' having a plurality of X coils 120a and a plurality of Y coils 120b. Along an x-axis, X coils 120a and Y coils 120b are arranged as coil pairings in which at least one X coil 120a is positioned on top of at least one Y coil 120b and at least one Y coil 120b is positioned on top of at least one X coil 120a. In areas in which X coils 120a are positioned on top of Y coils 120b, X coils 120a may operate with better efficiency than Y coils 120b. Alternatively, in areas in which Y coils 120b are positioned on top of X coils 120a, Y coils 120b operate with better efficiency than X coils 102a. In one embodiment, if the coil pairings are sufficiently small compared to the size of the magnet arrays, an arrangement where half of the coil pairings have X coils 120a positioned on top of Y coils 120b may provide substantially equal efficiency for both X and Y coils.

As previously mentioned, a magnet array that is substantially divided or otherwise segregated into quadrants may be such that the quadrants are spaced apart in at least one direction, as for example along an x-axis. Providing spacing within a magnet array may effectively ensure that coil groups may cooperate with magnets of substantially only one quadrant of the magnet array to generate a relatively strong force. When a plurality of energized X coils and a quadrant of magnets extending in a Y direction overlap, e.g., an XZ quadrant, substantially independently controlled forces may generated in an X direction and in a Z direction. The presence of a space between quadrants of magnets is effectively an area that enables an energized coil, e.g., an energized X coil, and the space to overlap substantially without resulting in the generation of any forces.

Figure 3A:
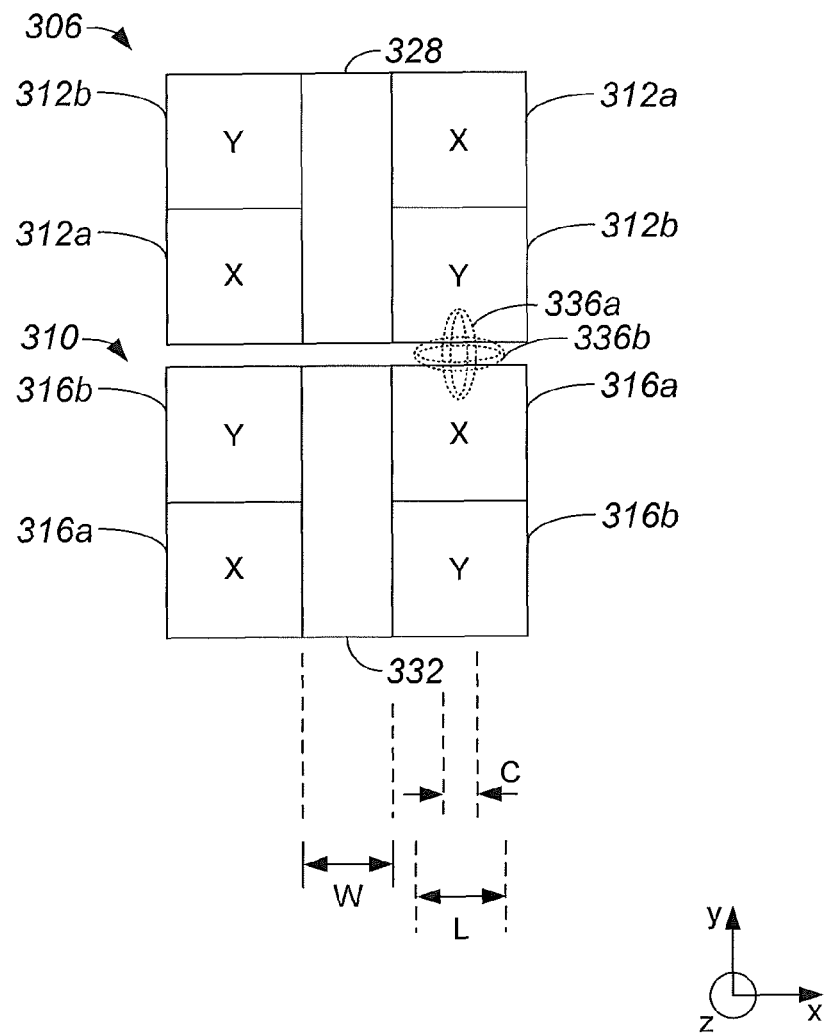
FIG. 3A is a diagrammatic representation of quadrants of magnets associated with magnet arrays of two stages in which a coil arranged to generate an X force is aligned with a quadrant of X magnets and a quadrant of Y magnets at a time t1 in accordance with an embodiment of the present invention.

FIG. 3A is a diagrammatic representation of quadrants of magnets associated with magnet arrays of two stages in which a coil arranged to generate an X force is aligned with a quadrant of X magnets and a quadrant of Y magnets at a time t1 in accordance with an embodiment of the present invention. A magnet array 306 associated with a first stage includes quadrants of magnets 312a, 312b, and a magnet array 310 associated with a second stage, e.g., a second stage that periodically operates in close proximity to a first stage or "scrums" with a first stage, includes quadrants of magnets 316a, 316b. When a second stage is in a scrum stage with a first stage, the two stages may come relatively close together in a synchronized manner to maintain a relatively small separation therebetween. Each quadrant 312a, 312b, 316a, 316b is configured to provide vertical forces, i.e., forces in a Z direction, along with horizontal forces that are perpendicular to the axis of magnets included in each quadrant 312a, 312b, 316a, 316b.

As shown, a substantially empty space 328, i.e., a space in which magnets are not positioned, is included between quadrants 312a, 312b along an x-axis, while a substantially empty space 332 is included between quadrants 316a, 316b along the x-axis. Empty space 328 is arranged to substantially separate quadrants 312a from substantially adjacent quadrants 312b along the x-axis. Similarly, empty space 332 is arranged to substantially separate quadrants 316a from substantially adjacent quadrants 316b along the x-axis.

Quadrants of magnets 312a, 316a include X magnets, or magnets which are arranged to provide force in an X direction, while quadrants of magnets 312b, 316b include Y magnets, or magnets which are arranged to provide force in a Y direction. That is, quadrants of magnets 312a, 316a are of an X orientation while quadrants of magnets 312b, 316b are of a Y orientation.

In one embodiment, a quadrant 312a which is of an X orientation is effectively adjacent to a quadrant 316b which is of a Y orientation, and a quadrant 312b which is of a Y orientation is effectively adjacent to a quadrant 316a which is of an X orientation. It should be appreciated that X magnets are generally arranged parallel to a y-axis, while Y magnets are generally arranged parallel to an x-axis. In the embodiment as shown, each quadrant of magnets 312a, 316a includes X magnets and not Y magnets, while each quadrant of magnets 312b, 316b includes Y magnets and not X magnets.

Quadrants of magnets 312a, 316a are configured to cooperate with a coil 336a to provide force in an X direction, and quadrants of magnets 312b, 316b are configured to cooperate with a coil 336b to provide force in a Y direction. Coil 336a is an X coil and coil 336b is a Y coil that are both part of a stator (not shown) that is effectively shared by magnet array 306 and magnet array 310, and are arranged to be energized or activated when at least one of coils 336a, 336b fully or partially overlaps with quadrants of magnets 312a and/or quadrants of magnets 316a.

As shown, at a time t1, coil 336a is arranged such that a part of coil 336a partially overlaps with a quadrant 312b of magnet array 306 and with a quadrant 316a of magnet array 310. When coil 336a is energized, coil 336a cooperates with a quadrant 316a of magnet array 310 to drive the second stage (not shown) with which magnet array 310 is coupled. Although part of coil 336a also effectively overlaps a quadrant 312b of magnet array 306, because coil 336a is an X coil, the first stage (not shown) with which magnet array 306 is coupled is not driven using coil 336a at time t1. It should be appreciated that at time t1, if coil 336b is energized, coil 336b cooperates with a quadrant 312b of magnet array 306 to drive the first stage (not shown) with which magnet array 306 is coupled. In one embodiment, coil 336b is located substantially underneath coil 336a.

In the embodiment as shown, alone an x-axis, coil 336a has a coil width C and coil 336b has a coil length L, while empty spaces 328, 336 have a width W. Width W is typically selected to be greater than or approximately equal to coil length L, and is also greater than or approximately equal to coil width C. By selecting width W to be greater than or approximately equal to coil width C, coil 336a will not overlap two quadrants 312a at the same time. Similarly, when width W is greater than or approximately equal to coil width C, coil 336a also will not overlap two quadrants 316a at the same time. In addition, coil 336a will not overlap a quadrant 312a and a quadrant 316a at the same time.

By selecting width W to be greater than or approximately equal to coil length L, coil 336b will not overlap two quadrants 312b at the same time. Similarly, by selecting width W to be greater than or approximately equal to coil length L, coil 336b also will not overlap two quadrants 316b at the same time. In addition, coil 336b will not overlap both a quadrant 312b and a quadrant 316b at the same time.

When width W is sized to be greater than or approximately equal to coil width C, then force-producing regions associated with each stage (not shown) associated with magnet arrays 306, 310 generally do not overlap, and a substantially minimum operating distance between magnet array 306 and magnet array 310 may be as little as approximately zero millimeters (mm). It should be appreciated that although both empty space 328 and empty space 332 are shown as having the same width W, each empty space 328, 332 may have different widths with each width being greater or equal to coil width C. It should be appreciated that if the empty space on one stage is wider than the width or length in an X direction of coils 336a, 336b, the stages (not shown) may operate with almost zero spacing between them in a Y direction substantially without precisely following each other in the X direction. Further, the stages are able to move along the Y direction with almost zero spacing between them.

Figure 3B:
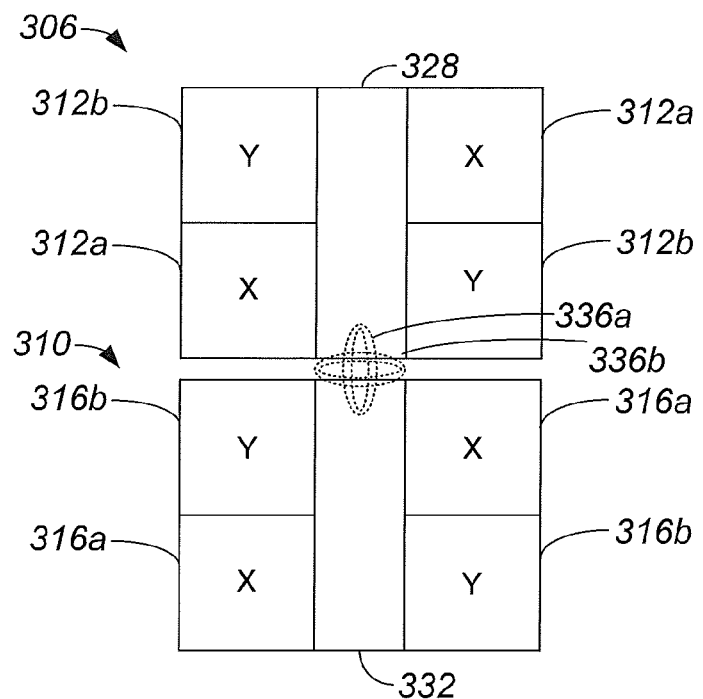
FIG. 3B is a diagrammatic representation of quadrants of magnets associated with magnet arrays of two stages in which a coil arranged to generate an X force, e.g., coil 336 of FIG. 3A, is aligned with an empty space between a quadrant of X magnets and a quadrant of Y magnets at a time t2 in accordance with an embodiment of the present invention.
Figure 3B:
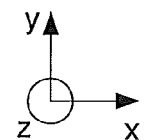

At a time t2, coil 336a is positioned such that part of coil 336a overlaps with empty space 328 and part of coil 336a overlaps with empty space 332, as shown in FIG. 3B. Thus, coil 336a is not associated with the generation of any forces at time t2. It should be appreciated that when coil 336a is positioned to partially overlap with empty space 328 and with empty space 332, coil 336a may be deactivated.

Figure 3C:
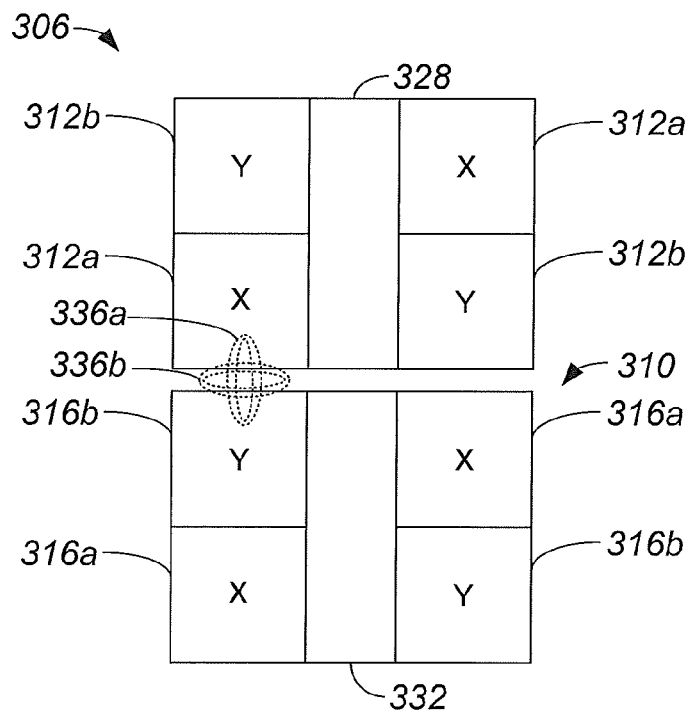
FIG. 3C is a diagrammatic representation of quadrants of magnets associated with magnet arrays of two stages in which a coil arranged to generate an X force, e.g., coil 336 of FIG. 3A, is aligned with a quadrant of X magnets and a quadrant of Y magnets at a time t3 in accordance with an embodiment of the present invention.

FIG. 3C is a representation of coils 336a, 336b at a time t3 in accordance with an embodiment of the present invention. At time t3, part of coil 336a overlaps with a quadrant 312a of magnet array 306 and a quadrant 316b of magnet array 310. When coil 336a overlaps with a quadrant 312a, coil 336 and quadrant 312a cooperate to drive the first stage (not shown) associated with magnet array 306.

As mentioned above, a plurality of stages that are included in a system such as an immersion lithography system may include a wafer stage and a second stage which may be a measurement stage, a tube carrier stage, or a second wafer stage. It should be appreciated that a tube carrier stage is a stage that is arranged to support, or otherwise carry, cables and hoses that supply the wafer stage. In general, the second stage may preferably operate at least some of the time in relatively close proximity to a wafer stage. A second stage may approach relatively close to a wafer stage, in one embodiment, when a quadrant of magnets of the second stage that is arranged to make force in an X direction is substantially adjacent to a quadrant of magnets of the wafer stage that is arranged to make force in a Y direction, and/or vice versa. The force on each quadrant of each stage may generally be independently controlled, as a quadrant arranged to make force in an X direction does not interact strongly with any overlapping Y coils, and a quadrant arranged to make force in a Y direction does not interact strongly with any overlapping X coils.

Figure 4:
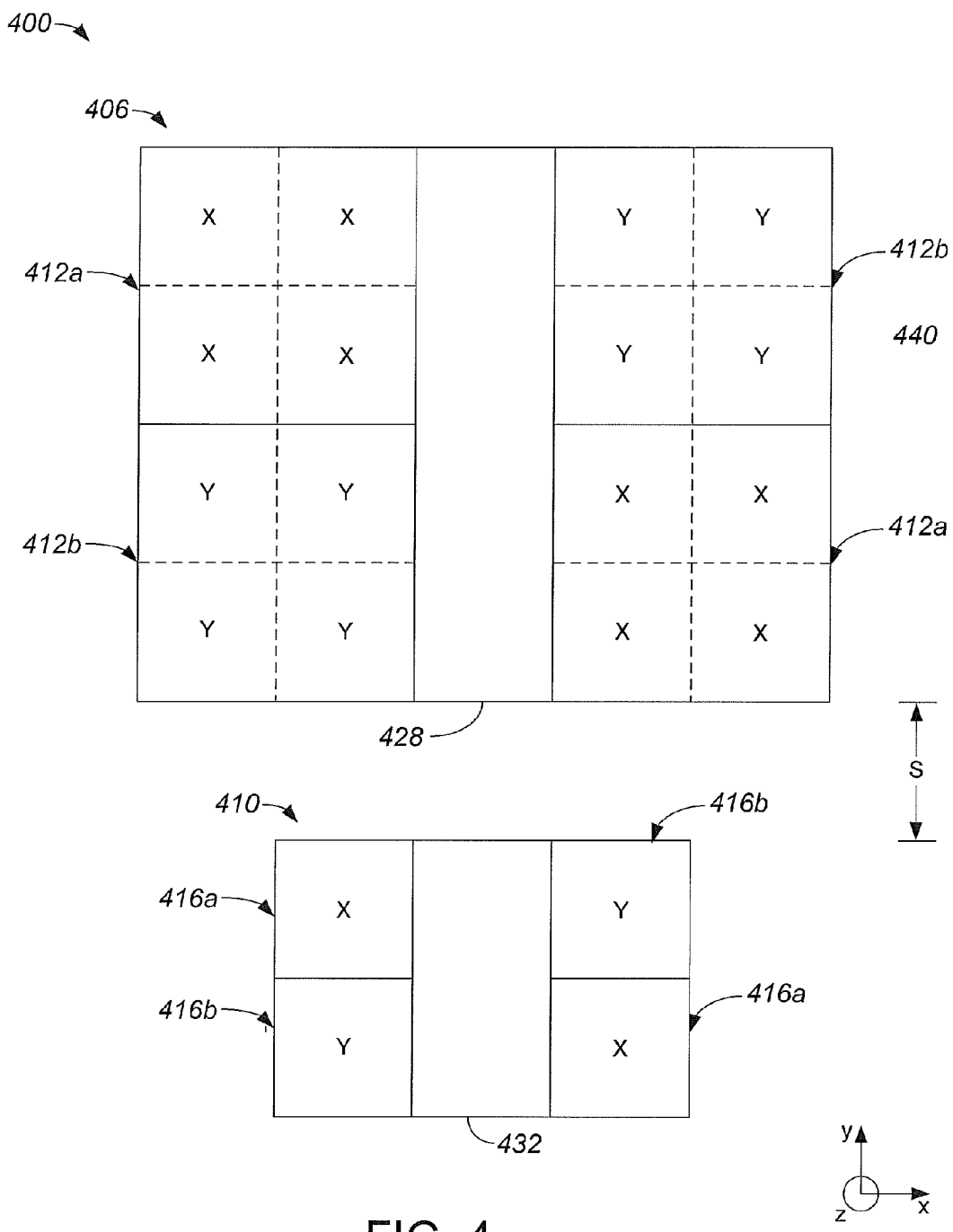
FIG. 4 is a diagrammatic representation of a stage arrangement that includes a plurality of stages each having quadrants of magnets in accordance with an embodiment of the present invention.

With reference to FIG. 4, a stage arrangement that includes a plurality of stages, e.g., a wafer stage and a measurement stage or a tube carrier stage, each having a magnet array substantially coupled thereon that includes quadrants of magnets will be described in accordance with an embodiment of the present invention. A stage arrangement 400 includes a first magnet array 406 that is substantially coupled to a wafer stage (not shown) and a second magnet array that is 410 that is substantially coupled to a measurement stage (not shown) or a tube carrier stage (not shown).

First magnet array 406, as shown, includes four quadrants 412a, 412b. X quadrants 412a include X magnets (not shown) that are oriented substantially parallel to a y-axis such that the X magnets may cooperate with overlapping energized X coils (not shown) of a stator (not shown) to generate force in a direction along an x-axis or, more generally in a direction that is substantially perpendicular to the longitudinal axis of the X magnets. Y quadrants 412b include Y magnets (not shown) that are oriented substantially parallel to an x-axis such that the Y magnets may cooperate with overlapping energized Y coils (not shown) of a stator (not shown) to generate force in a direction along a y-axis or, more generally in a direction that is substantially perpendicular to the longitudinal axis of the Y magnets. In one embodiment, quadrants 412a, 412b have a pitch that is in a range of between approximately 50 mm and approximately 120 mm, e.g., approximately 60 mm, and first linear magnet array 406 may be approximately 600 mm by approximately 480 mm. It should be appreciated that quadrants 412a include X magnets (not shown) and do not include Y magnets, while quadrants 412b include Y magnets (not shown) and do not include X magnets.

It should be appreciated that each quadrant 412a, 412b is capable of producing forces in a direction along a z-axis. That is, each quadrant 412a is arranged to generate X forces and Z forces, while each quadrant 412b is arranged to generate Y forces and Z force.

Quadrants 412a, 412b are substantially separated along an x-axis by a substantially empty space 428. As described above, the width of empty space 428 along the x-axis may be greater than or approximately equal to the length of a coil (not shown) of a stator (not shown) which cooperates with first linear magnet array 406 to effectively form a planar motor. In one embodiment, the size of a coil (not shown), e.g., the length of the coil, is a multiple of a pitch of magnets included in quadrants 412a, 412b. For example, when quadrants 412a, 412b, 416a, 416b have a pitch of approximately 60 mm, a coil length may be approximately twice the pitch at approximately 120 mm and, hence, a width of empty space 428 relative to the x-axis may be approximately twice the pitch at approximately 120 mm. In the embodiment as shown, quadrants 412a, 412b may each be approximately 240 mm by approximately 240 mm, and substantially empty space 428 included within first linear magnet array 406 may have a width relative to an x-axis of approximately 120 mm.

Second magnet array 410 includes X quadrants 416a which each include at least one X magnet (not shown) and Y quadrants 416b which each include at least one Y magnet (not shown). While the number of magnets included in each quadrant 416a, 416b may vary, in the described embodiment, quadrants 416a, 416b typically each include between approximately four and approximately 32 magnets. Quadrants 416a, 416b are spaced apart along an x-axis by a substantially empty space 432. In one embodiment, quadrants 416a, 416b have a pitch that is equal to approximately 60 mm, empty space 432 may have a width along an x-axis of approximately 120 mm, and second magnet array 410 may be approximately 360 mm by approximately 240 mm. Quadrants 416a, 416b may each be approximately 120 mm by approximately 120 mm.

In order for a measurement stage (not shown) or a tube carrier stage (not shown) that is substantially coupled to second magnet array 410 to move in relatively close proximity to a wafer stage (not shown) that is substantially coupled to first magnet array 406, quadrants 416a, 416b of second magnet array 410 that are substantially adjacent to quadrants 412a, 412b of first magnet array 406 are arranged to be of an opposite orientation. As shown, relative to a y-axis, an X quadrant 412a is substantially adjacent to a Y quadrant 416b, while a Y quadrant 412b is substantially adjacent to an X quadrant 416a. Hence, in one embodiment, a wafer stage (not shown) and a measurement stage (not shown) or a tube carrier stage (not shown) may effectively come into contact with each other. In other words, a substantially minimum operational distance between first magnet array 406 and second magnet array 410 may be approximately zero mm, e.g., a distance S may be as small as approximately zero mm.

Figure 5:
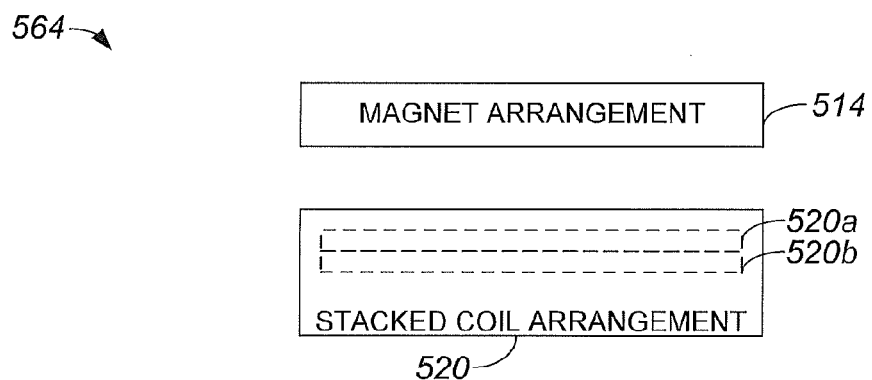
FIG. 5 is a diagrammatic representation of a planar motor with a stacked coil arrangement in accordance with an embodiment of the present invention.

FIG. 5 is a diagrammatic representation of a planar motor that includes a stator with a stacked coil arrangement in accordance with an embodiment of the present invention. A planar motor 564 includes a magnet arrangement 514 that is generally coupled to a stage (not shown) such as a wafer stage, measurement stage, or a tube carrier stage. The magnet arrangement 514 may be, in one embodiment, arranged in quadrants, each of which is a linear magnet array, that are spaced apart along at least one axis. It should be appreciated, however, that magnet arrangement 514 may generally be any suitable magnet arrangement.

Planar motor 564 also includes a stacked coil arrangement 520 that is part of a stator. Stacked coil arrangement 520 includes at least one X coil 520a and at least one Y coil 520b that are stacked. Although at least one X coil 520a is shown as being stacked over at least one Y coil 520b, at least one Y coil 520b may instead be stacked over at least one X coil 520a.

The magnet arrays associated with stages may have a variety of different configurations. As previously mentioned, linear magnet arrays generally include either square quadrants or rectangular quadrants, although it should be appreciated that magnet arrays are not limited to including square quadrants or rectangular quadrants. Further, while magnet arrays have been described as including substantially empty spaces between at least some adjacent quadrants, some magnet arrays may not include empty spaces located between adjacent quadrants.

Figure 6A:
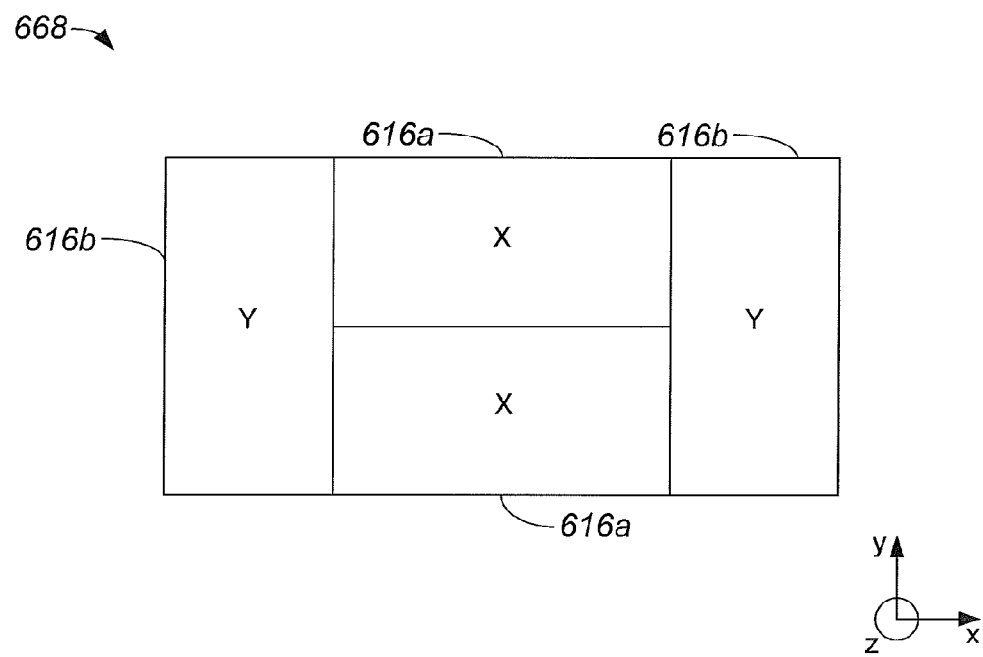
FIG. 6A is a diagrammatic representation of a first magnet array suitable for use in a measurement stage or a tube carrier in accordance with an embodiment of the present invention.

As will be described with respect to FIG. 6A-D, magnet arrays associated with wafer stages, measurement stages, tube carriers, or other types of planar motor driven stages may include a variety of different configurations. FIG. 6A is a diagrammatic representation of a first magnet array suitable for use in a stage or a tube carrier in accordance with an embodiment of the present invention. A magnet array 668 includes a plurality of rectangularly shaped quadrants 616a, 616b that are arranged such that there are effectively no empty spaces, e.g., no relatively significant gaps, located between adjacent quadrants 616a, 616b. In one embodiment, magnet array 668 may be approximately 240 mm by approximately 480 mm, although it should be understood that the dimensions of magnet array 668 may vary widely.

Figure 6B:
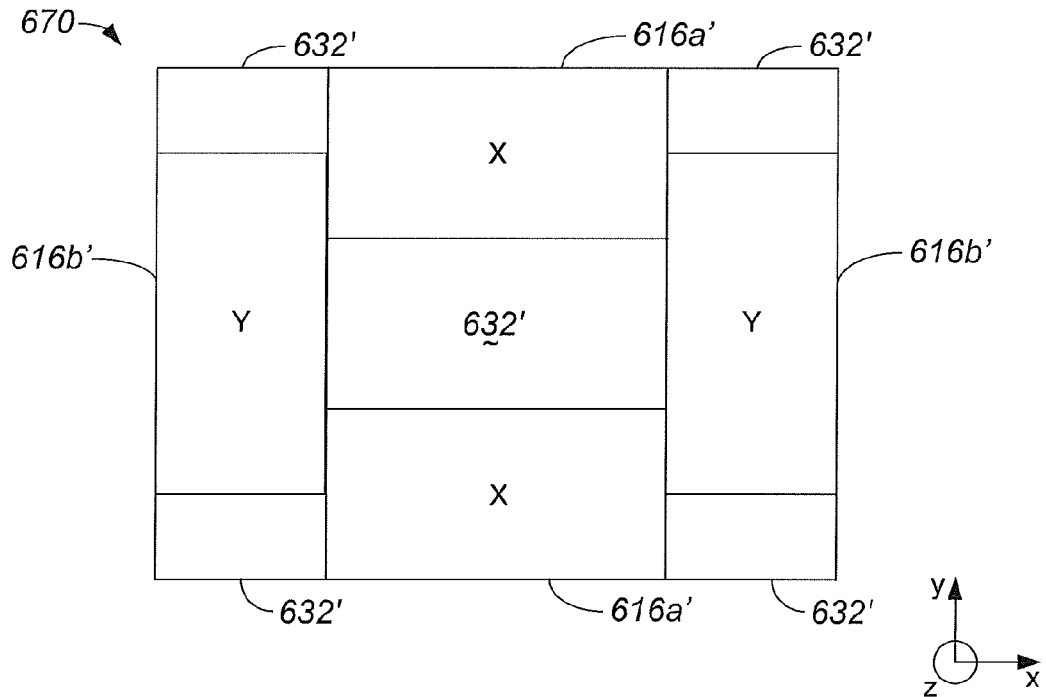
FIG. 6B is a diagrammatic representation of a second magnet array suitable for use in a measurement stage or a tube carrier in accordance with an embodiment of the present invention.

FIG. 6B is a diagrammatic representation of a second magnet array suitable for use in a stage or a tube carrier in accordance with an embodiment of the present invention. A magnet array 670 includes a plurality of rectangularly shaped quadrants 616a', 616b'. Substantially empty spaces 632' are arranged next to and between adjacent Y quadrants 616b', or quadrants 616b' that include magnets arranged to make a force in a Y direction, as well as next to and between adjacent X quadrants 616a', or quadrants 616a' that include magnets arranged to make a force in an X direction. In the embodiment as shown, magnet array 670 may be approximately 360 mm by approximately 480 mm, although it should be understood that the dimensions of magnet array 670 may vary widely.

Figure 6C:
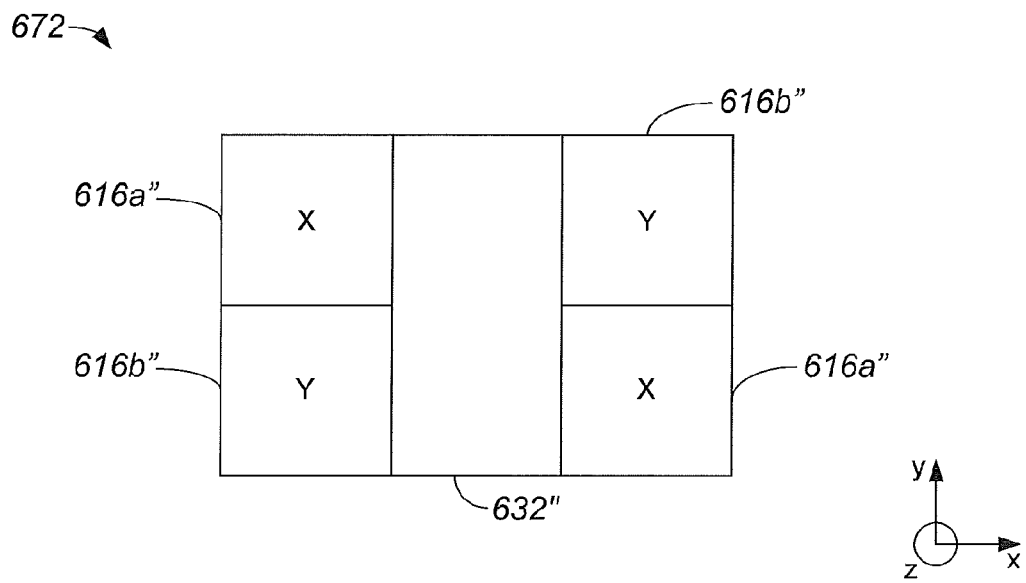
FIG. 6C is a diagrammatic representation of a third magnet array suitable for use in a measurement stage or a tube carrier in accordance with an embodiment of the present invention.

FIG. 6C is a diagrammatic representation of a third magnet array suitable for use in a stage or a tube carrier in accordance with an embodiment of the present invention. A magnet array 672 includes a plurality of quadrants 616a", 616b". A substantially empty space 632" is arranged such that quadrants 616a" and quadrants 616b" are spaced apart relative to an x-axis, as shown. X quadrants 616a", or quadrants 616a" that include magnets arranged to make a force in an X direction, and Y quadrants 616b", or quadrants 616b" that include magnets arranged to make a force in a Y direction, are substantially square shaped. In the embodiment as shown, magnet array 672 may be approximately 240 mm by approximately 360 mm, although it should be understood that the dimensions of magnet array 672 may vary widely.

Figure 6D:
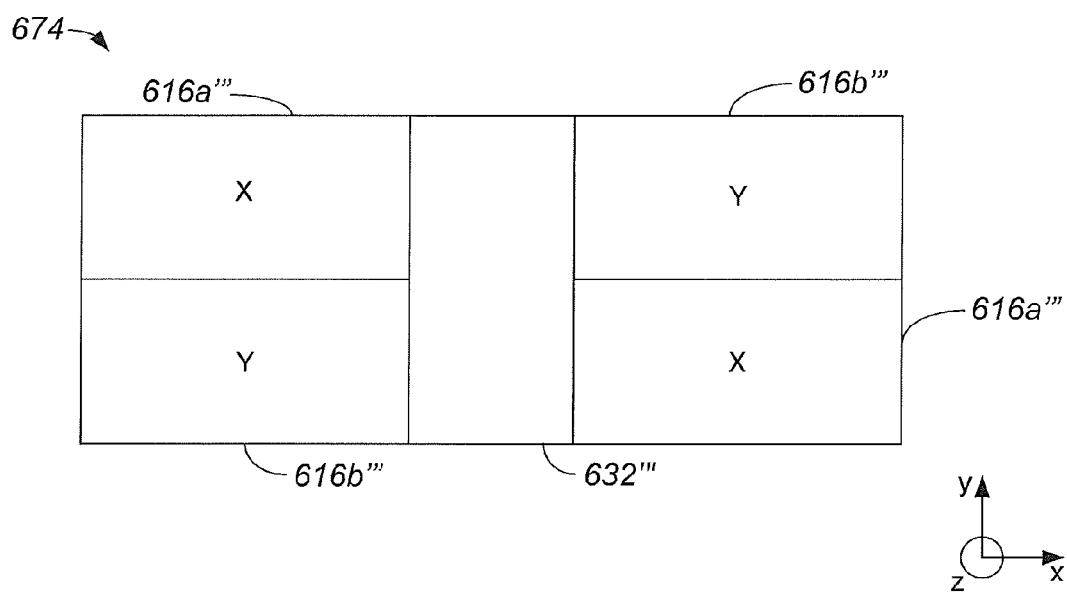
FIG. 6D is a diagrammatic representation of a fourth magnet array suitable for use in a measurement stage or a tube carrier in accordance with an embodiment of the present invention.

FIG. 6D is a diagrammatic representation of a fourth magnet array suitable for use in a stage or a tube carrier in accordance with an embodiment of the present invention. A magnet array 674 includes a plurality of rectangularly shaped quadrants 616a''', 616b'''. A substantially empty space 632''' is arranged such that quadrants 616a''' and quadrants 616b''' are spaced apart relative to an x-axis, as shown. X quadrants 616a''', or quadrants 616a''' that include magnets arranged to make a force in an X direction, and Y quadrants 616b''', or quadrants 616b''' that include magnets arranged to make a force in a Y direction, are substantially rectangularly shaped. In the embodiment as shown, magnet array 674 may be approximately 240 mm by approximately 600 mm, although it should be understood that the dimensions of magnet array 674 may vary widely.

Figure 10:
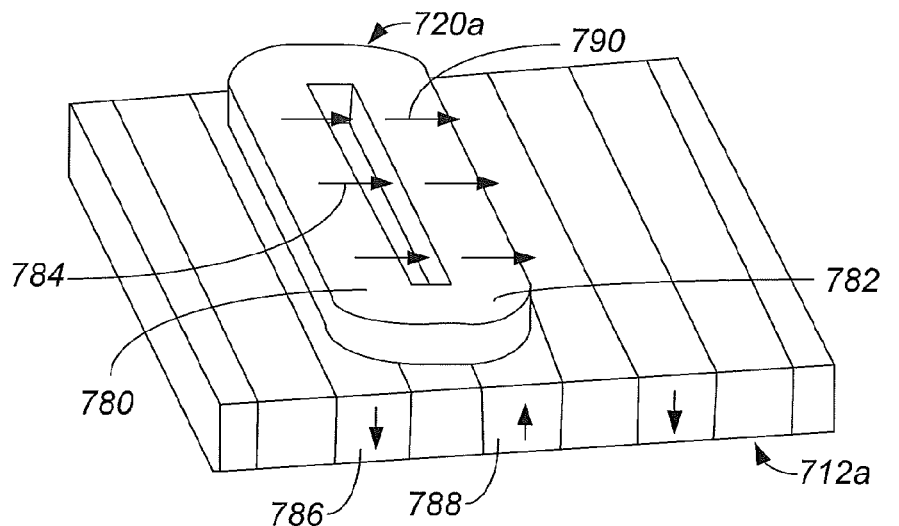
FIG. 10 is a diagrammatic representation of force directions associated with the positioning of an X coil over an X magnet array in accordance with an embodiment of the present invention.

As mentioned above, the direction in which a force is generated may vary depending upon the positioning of a coil relative to magnets in a magnet array. FIG. 10 is a diagrammatic representation of force directions associated with the positioning of an X coil over an X magnet array in accordance with an embodiment of the present invention. An X coil 720a is positioned over an X magnet array 712a. Coil 720a includes, as shown, a first side 780 and a second side 782. X magnet array 712a includes at least a first magnet 786 and a second magnet 788.

When coil 720a is positioned such that first side 780 is positioned over first magnet 786 and that second side 782 is positioned over second magnet 788. Specifically, first side 780 interacts with first magnet 786 to produce a force 784 in a positive direction relative to an x-axis, while second side 782 interacts with second magnet 788 to produce a force 790 in a positive direction relative to the x-axis.

Figure 11:
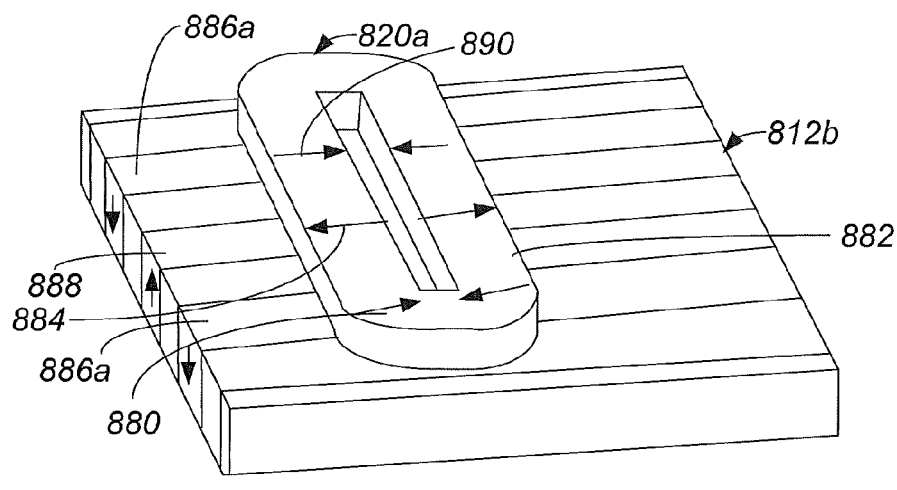
FIG. 11 is a diagrammatic representation of force directions associated with the positioning of an X coil over a Y magnet array in accordance with an embodiment of the present invention.

FIG. 11 is a diagrammatic representation of force directions associated with the positioning of an X coil over a Y magnet array in accordance with an embodiment of the present invention. An X coil 820a is positioned over a Y magnet array 812b. Coil 820a includes, as shown, a first side 880 and a second side 882. Y magnet array 812b includes south magnets 886a, 886b and a north magnet 888.

When coil 820a is positioned as shown, first side 880 interacts with south magnets 886a, 886b to produce force 890 in a positive direction relative to an x-axis. First side 880 interacts with north magnet 888 such that force 884 in a negative direction relative to the x-axis is produced. When coil 820a is positioned as shown, second side 882 interacts with south magnets 886a, 886b to produce force 884 in a negative direction relative to an x-axis, and interacts with north magnet 888 such that force 890 in a positive direction relative to the x-axis is produced.

Figure 12:
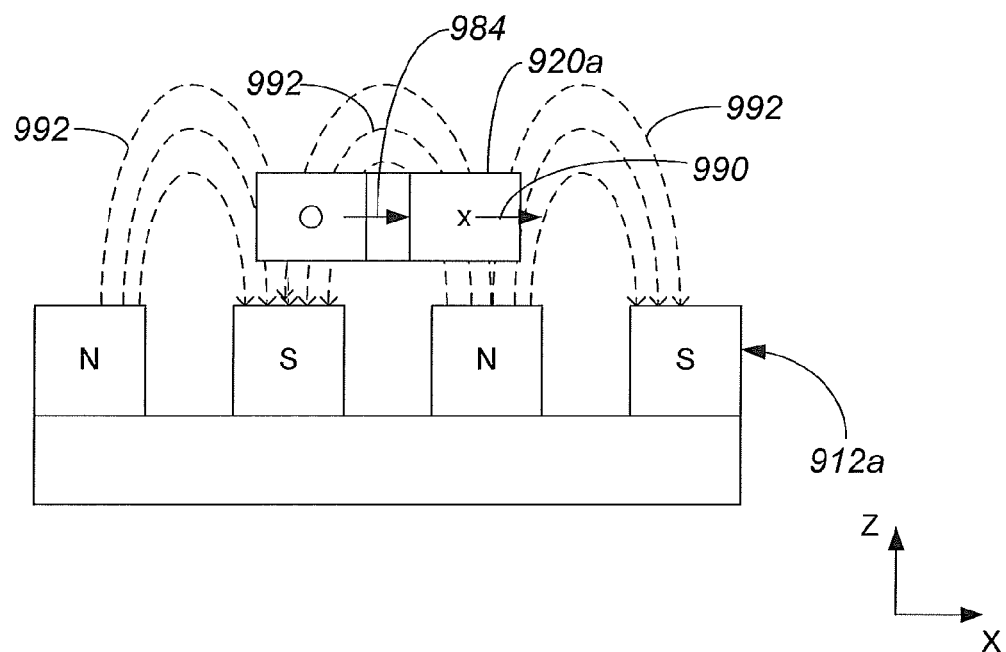
FIG. 12 is a diagrammatic representation of flux directions and force directions associated with the positioning of an X coil over an X magnet array in accordance with an embodiment of the present invention.

FIG. 12 is a diagrammatic cross-sectional side-view representation of flux directions and force directions associated with the positioning of an X coil over an X magnet array in accordance with an embodiment of the present invention. An X coil 920a is positioned over an X magnet array 912a, Flux lines 992 indicate the directions of magnetic flux that are generated, while arrows 984, 990 indicate force directions that are generated, when X coil 920a is positioned as shown. Forces 984, 990 are along the same direction, e.g., a positive direction along an x-axis.

Figure 13:
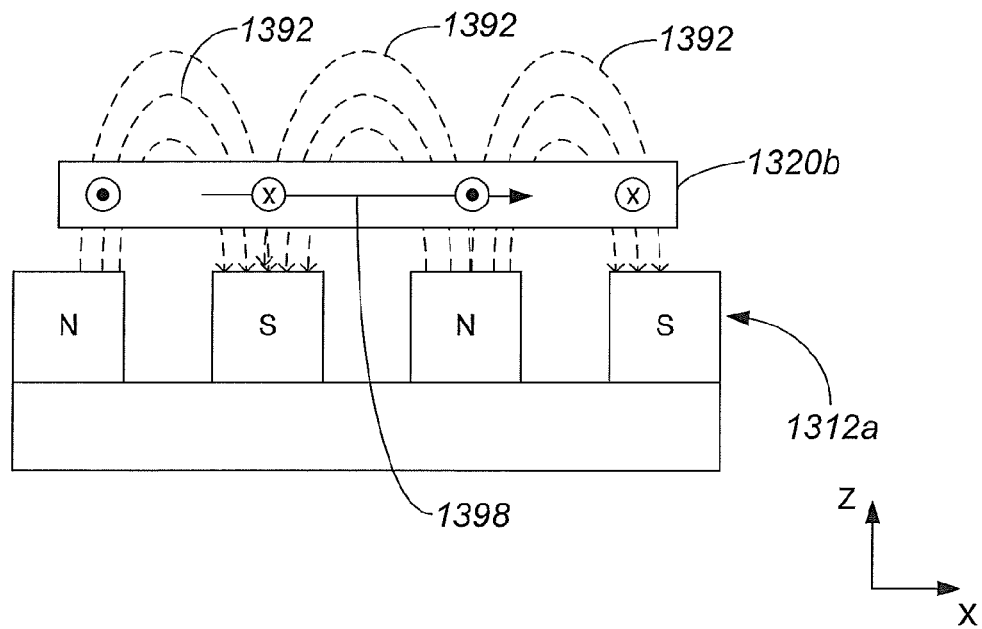
FIG. 13 is a diagrammatic representation of flux directions and force directions associated with the positioning of a Y coil over an X magnet array in accordance with an embodiment of the present invention.

FIG. 13 is a diagrammatic cross-sectional side-view representation of flux directions and force directions associated with the positioning of a Y coil over an X magnet array in accordance with an embodiment of the present invention. An Y coil 1320b is positioned over an X magnet array 1312a. Flux lines 1392 indicate the directions of magnetic flux that are generated, while arrow 1398 indicates a force direction that is generated, when Y coil 1320b is positioned as shown.

Figure 14:
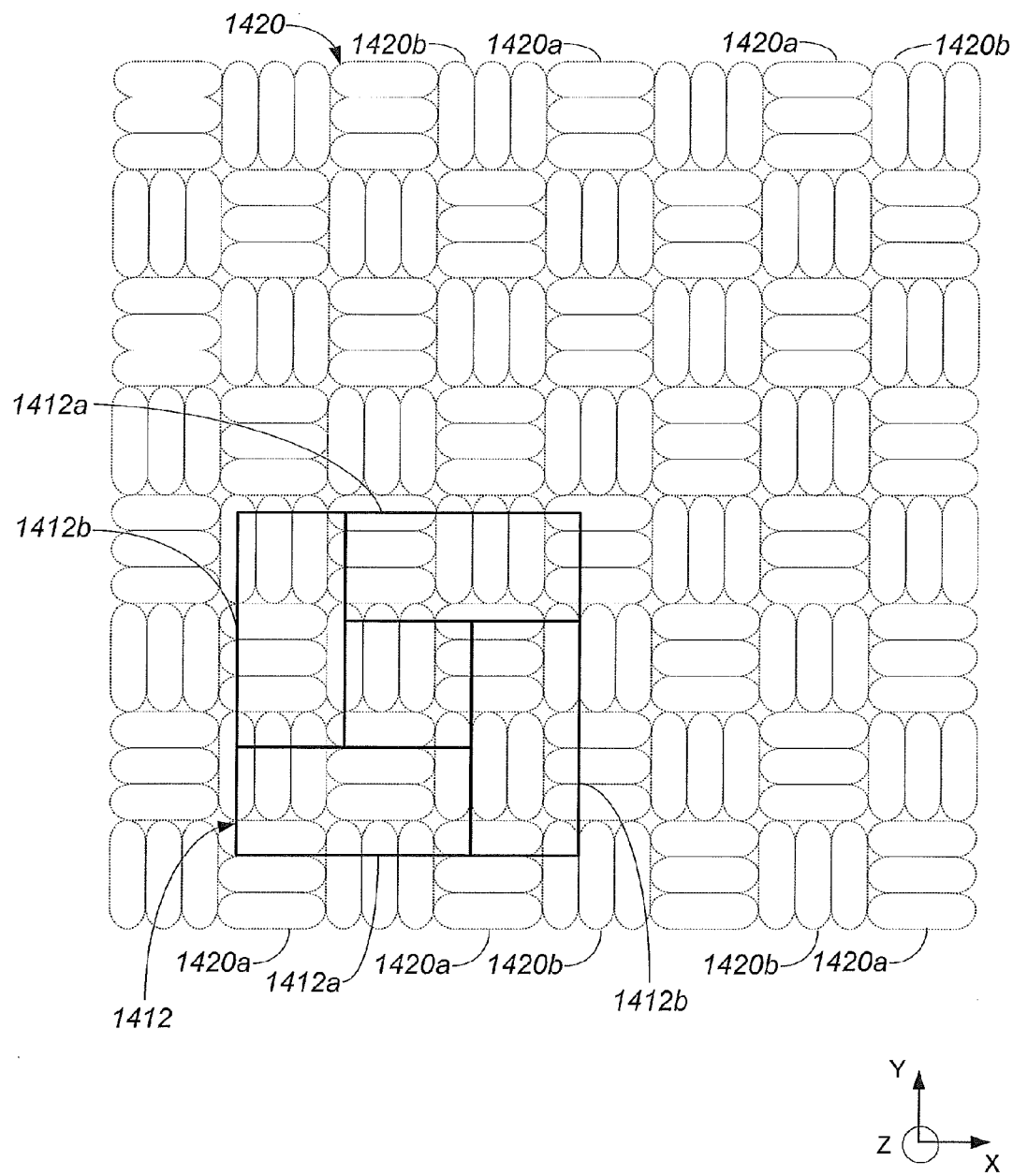
FIG. 14 is a diagrammatic representation of a moving magnet planar motor coil array and a magnet array in accordance with an embodiment.

FIG. 14 is a diagrammatic representation of a moving magnet planar motor coil array and a magnet array in accordance with an embodiment. A moving magnet planar motor coil array 1420 includes a substantially "checkerboard" coil configuration. As shown, X coil groups 1420a and Y coil groups 1420b, which are each substantially square in shape, are effectively arranged in a checkerboard pattern. Each coil group 1420a, 1420b may have dimensions of approximately "N" by "N", e.g., approximately 100 millimeters by approximately 100 millimeters.

An overall magnet array 1412, which may be coupled to a stage (not shown) such as a measurement stage, includes X magnet groups 1412a and Y magnet groups 1412b. Typically, each magnet group or subarray 1412a, 1412b may have a size that is greater than or approximately equal to the size of two adjacent coil groups 1420a, 1420b. In one embodiment, each magnet group 1412a, 1412b may have dimensions of approximately "N" by approximately "2N", e.g., approximately 100 millimeters by approximately 200 millimeters.

A stage (not shown) that is coupled to overall magnet array 1412 may have substantially the same dimensions as overall magnet array 1412 with respect to an x-axis and a y-axis, or may have larger dimensions than overall magnet array 1412 with respect to the x-axis and the y-axis. Thus, in one embodiment, a stage (not shown) may have dimensions of at least approximately "3N" by approximately "3N".

Figure 15:
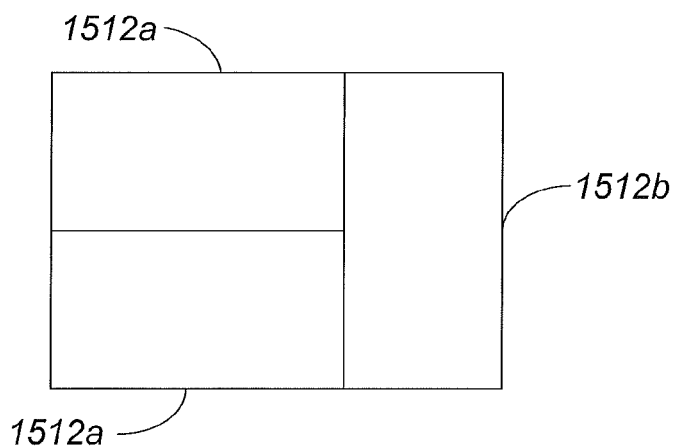
FIG. 15 is a diagrammatic representation of a magnet array that is of a substantially minimum size configuration that is suitable for use with a moving magnet planar motor coil array in accordance with an embodiment.
Figure 15:
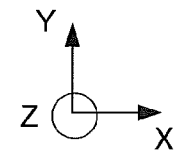

FIG. 15 is a diagrammatic representation of a magnet array that is of a substantially minimum size configuration that is suitable for use with a moving magnet planar motor coil array, as for example planar motor coil array 1420 of FIG. 14, in accordance with an embodiment. A magnet array 1512 includes two X magnet groups 1512a, which contains X magnets, and a Y magnet group 1512b which contains Y magnets. Magnet array 1512 is configured to provide independent control of up to three vertical forces, e.g., forces along a z-axis. Magnet array 1512 may have overall dimensions of approximately "3N" by approximately "2N".

Figure 7:
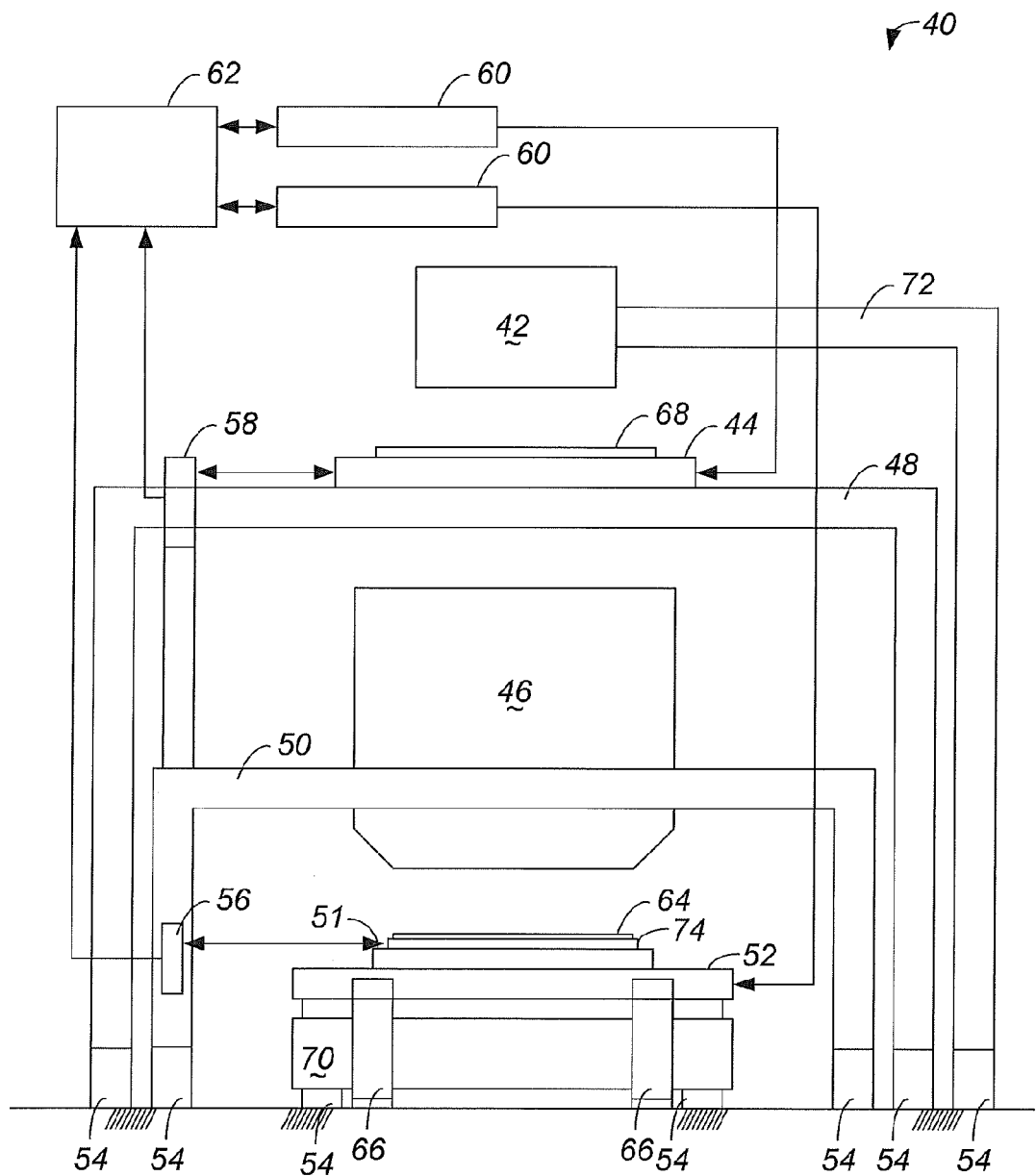
FIG. 7 is a diagrammatic representation of a photolithography apparatus in accordance with an embodiment of the present invention.

With reference to FIG. 7, a photolithography apparatus which may include planar motors having a stacked coil configuration and/or magnets arranged in quadrants having at least some substantially empty spaces there between to enable two stages to efficiently operate in relatively close proximity to each other as discussed above will be described in accordance with an embodiment. Such a planar motor may be used as a part of a wafer stage for positioning a wafer and a reticle stage for positioning a reticle (mask). In FIG. 7, a planar motor is used for the wafer stage and a photolithography apparatus (exposure apparatus) 40 includes a wafer positioning stage 52 that may be driven by a planar motor (not shown), as well as a wafer table 51. The planar motor which drives wafer positioning stage 52 generally uses an electromagnetic force generated by magnets and corresponding armature coils arranged in two dimensions.

A wafer 64 is held in place on a wafer holder or chuck 74 which is coupled to wafer table 51. Wafer positioning stage 52 is arranged to move in multiple degrees of freedom, e.g., in up to six degrees of freedom, under the control of a control unit 60 and a system controller 62. In one embodiment, wafer positioning stage 52 may include a plurality of actuators and have a configuration as described above. The movement of wafer positioning stage 52 allows wafer 64 to be positioned at a desired position and orientation relative to a projection optical system 46.

Wafer table 51 may be levitated in a z-direction 10b by any number of voice coil motors (not shown), e.g., three voice coil motors. In one described embodiment, at least three magnetic bearings (not shown) couple and move wafer table 51 along a y-axis 10a, along an x-axis 10c, and about a z-axis 10b. In another embodiment, wafer table 51 may move as a fine stage which is arranged to move in multiple degrees of freedom, e.g., in up to six degrees of freedom to position a wafer in fine motion. The stator of the planar motor of wafer positioning stage 52 is typically supported by a base 70. Base 70 may be supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties. In preferred embodiments, base 70 acts as a countermass absorbing the reaction force from the positioning stage 52.

An illumination system 42 is supported by a frame 72. Frame 72 is supported to the ground via isolators 54. Illumination system 42 includes an illumination source, which may provide a beam of light that may be reflected off of or transmitted through a reticle. In one embodiment, illumination system 42 may be arranged to project radiant energy, e.g., light, through a mask pattern on a reticle 68 that is supported by and scanned using a reticle stage 44 which may include a coarse stage and a fine stage or may be a single stage. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. A second interferometer 58 is supported on projection optical system 46, and detects the position of reticle stage 44 which supports a reticle 68. Interferometer 58 also outputs position information to system controller 62. In some embodiments additional interferometer or other sensors, such as position encoders, may be used to monitor the position of the wafer table 51 relative to the projection optics frame 50.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is moved by wafer positioning stage 52 perpendicularly to the optical axis of projection optical system 46 so that the next field of semiconductor wafer 64 is brought into position relative to illumination system 42, reticle 68, and projection optical system 46 for exposure. After this exposure, these steps are repeated so that images on reticle 68 may be sequentially exposed onto the fields of wafer 64.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an F2-type laser (157 nm). Alternatively, illumination system 42 may also use charged particle beams such as x-ray and electron beams. For instance, in the case where an electron beam is used, thermionic emission type lanthanum hexaboride (LaB6) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser are used, glass materials such as quartz and fluorite that transmit far ultra-violet rays is preferably used. When either an F2-type laser or an x-ray is used, projection optical system 46 may be either catadioptric or reflective (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave minor. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, are all incorporated herein by reference in their entireties. These examples describe a reflecting-refracting type of optical system that incorporates a concave mirror, but without a beam splitter, and may also be suitable for use with the present invention.

The present invention may be utilized, in one embodiment, in an immersion type exposure apparatus if suitable measures are taken to accommodate a fluid. For example, PCT patent application WO 99/49504, which is incorporated herein by reference in its entirety, describes an exposure apparatus in which a liquid is supplied to a space between a substrate (wafer) and a projection lens system during an exposure process. Aspects of PCT patent application WO 99/49504 may be used to accommodate fluid relative to the present invention.

Figure 16:
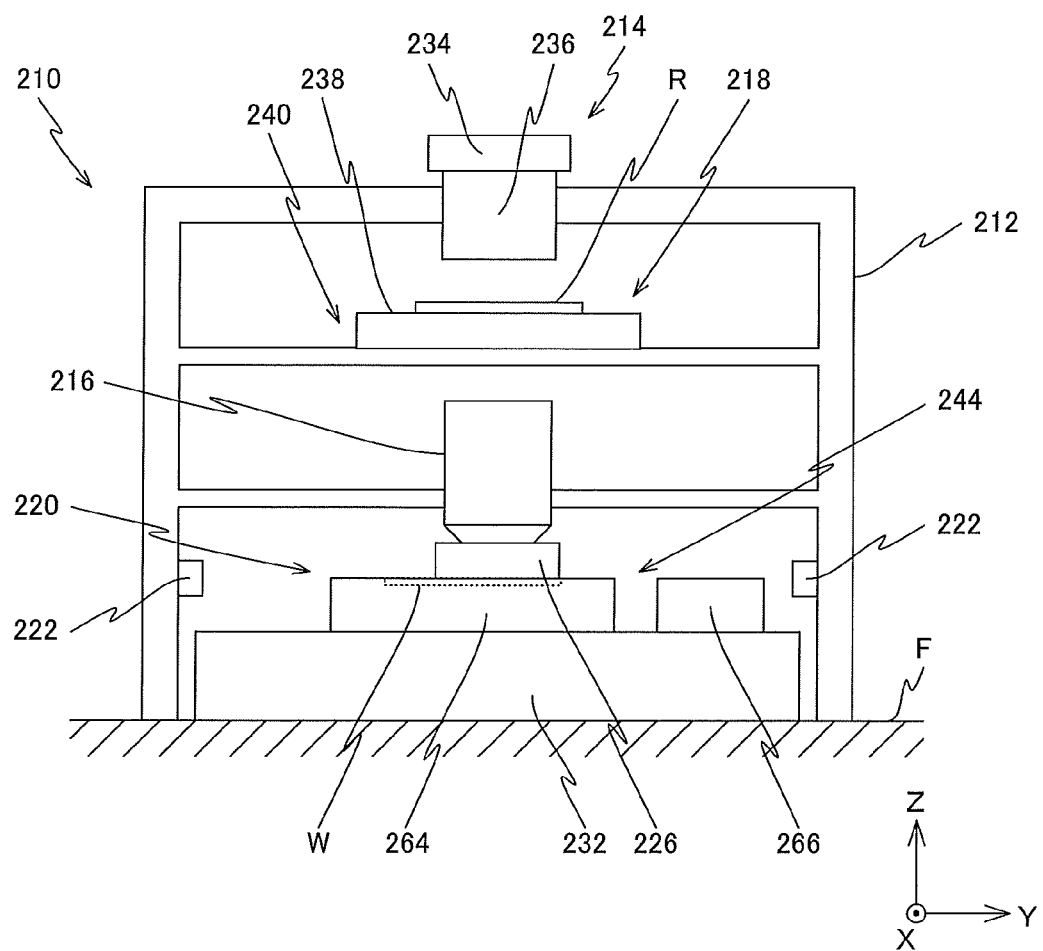
FIG. 16 is a diagrammatic representation which schematically shows an arrangement of an immersion type exposure apparatus, in accordance with an embodiment.

Next, an immersion type exposure apparatus in accordance with an embodiment will be described. FIG. 16 is a schematic illustration of an immersion type exposure apparatus (hereinafter, simply referred to as an exposure apparatus) 210 in accordance with an embodiment. The exposure apparatus 210 includes a frame 212, an illumination system (irradiation apparatus) 214, a reticle stage assembly 218, an optical assembly 216, a wafer stage assembly 220, a measurement system 222, a control system 224 (not shown in FIG. 16, refer to FIG. 19), and a fluid environmental system 226 (not shown in FIG. 16, refer to FIG. 19) and the like. The exposure apparatus 210 is installed on a floor surface F.

Exposure apparatus 210 is a scanning type exposure apparatus which transfers a pattern formed on a reticle R onto a wafer W with reticle R and wafer W moving synchronously. In a scanning type exposure apparatus, reticle R is moved perpendicularly (in an Y-axis direction) to an optical axis of optical assembly 216 by reticle stage assembly 218, and wafer W is moved perpendicularly (in the Y-axis direction) to the optical axis of optical assembly 216 by wafer stage assembly 220. Scanning of reticle R and wafer W occurs while reticle R and wafer W are moving synchronously.

Frame 212 is installed on floor surface F. Frame 212 supports the components of exposure apparatus 210, namely, illumination system 214, optical assembly 216, reticle stage assembly 218, and wafer stage assembly 220.

Illumination system 214 includes an illumination source 234 and an illumination optical assembly 236. Illumination source 234 emits a light beam. Illumination optical assembly 236 guides the light beam from illumination source 234 to reticle R. The light beam illuminates selectively different portions of reticle R.

Illumination source 234 may be a g-line source (436 nm), an i-line source (365 nm), a KrF excimer laser (248 nm), an ArF excimer laser (193 nm) or a F2 laser (157 nm). Alternatively, illumination source 234 may generate a charged particle beam or an X-ray beam.

Reticle stage assembly 218 includes a reticle stage 238 that retains reticle R and a reticle stage mover assembly 240 that drives reticle stage 238. The reticle stage mover assembly 240 moves reticle stage 238 in at least directions of three degrees of freedom, which are an X-axis direction, a Y-axis direction, and a rotation direction around a Z-axis (θz direction) using, for example, a driver such as a linear motor and the like.

Optical assembly 216 irradiates the light beam passing through reticle R on wafer W, and projects a reduced image of the pattern formed on reticle R on wafer W. Optical assembly 16 need not be limited to a reduction system, and could also be an equal or greater magnification system.

Wafer stage assembly 220 includes a base member 232 mounted on floor surface F, a wafer stage 264 which moves while retaining wafer W on base member 232, a measuring instrument such as an aerial image measuring instrument and the like, a measurement stage 266 on which measurement members such as reference marks and the like are provided, and a stage mover assembly 244 which drives wafer stage 264 and measurement stage 266.

Figure 17:
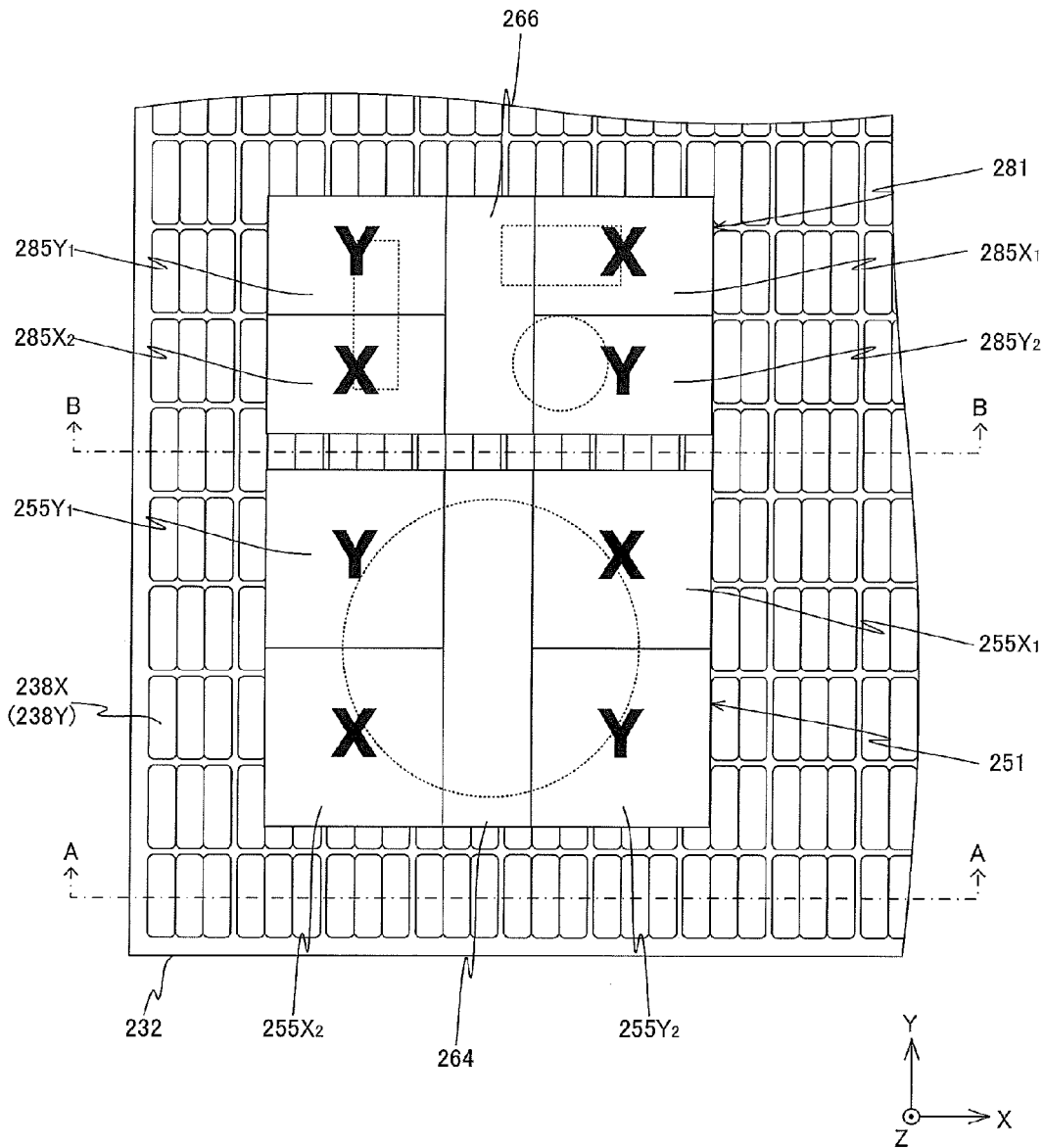
FIG. 17 is a planar view representing an arrangement of a wafer stage assembly, especially an arrangement of magnet units (magnets) within a wafer stage and a measurement stage that structure a stage mover assembly (planar motor), and an arrangement of coil units (armature coils) within a base member in accordance with an embodiment.
Figure 18A:
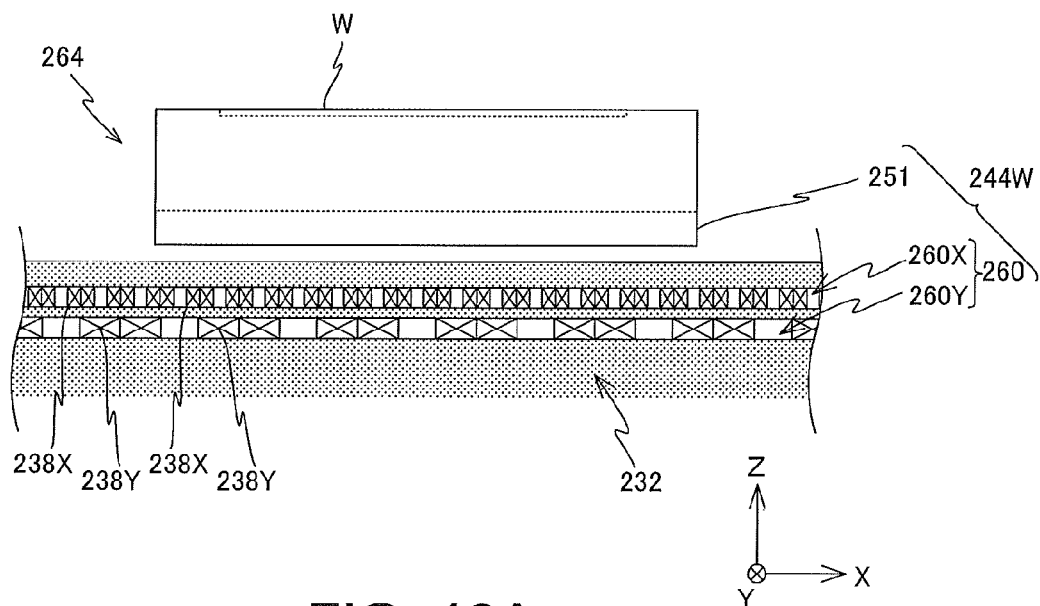
FIG. 18A is a cross section view along line A-A in FIG. 17.

Here, a configuration of each part of wafer stage 264, especially of stage mover assembly 244 which moves wafer stage 264 will be described in detail. FIG. 17 shows wafer stage assembly 220, especially, a planar view of an arrangement of armature coils 238X (238Y) within base member 232 and magnet units $255X_1$, $255X_2$, $255Y_1$, and $255Y_2$ within wafer stage 264. FIG. 18A shows a cross section view along line A-A in FIG. 17.

Wafer stage 264 includes a mover 251, a Z drive mechanism (not shown) and the like. Mover 251 is fixed to the bottom portion of wafer stage 264, and mover 251 and a stator 260 housed in the upper portion of base member 232 which will be described later structure a planar motor (wafer stage mover assembly) 244W. On wafer stage 264, wafer W is fixed, for example, by vacuum chucking. Incidentally, wafer stage mover assembly 244W and a measurement stage mover assembly 244M which will be described later will be referred to collectively as stage mover assembly 244.

Mover 251, as illustrated in FIG. 17, has a magnet unit $255X_1$ in a first quadrant (i.e., a portion which is half of the +X side and half of the +Y side) and a magnet unit $255X_2$ in a third quadrant (i.e., a portion which is half of the −X side and half of the −Y side), respectively. Further, mover 251 has a magnet unit $255Y_1$ in a second quadrant (i.e., a portion which is half of the −X side and half of the +Y side) and a magnet unit $255Y_2$ in a fourth quadrant (a portion which is half of the +X side and half of the −Y side), respectively. Here, space of a predetermined width is provided between magnet unit $255X_1$ and magnet unit $255Y_1$, and magnet unit $255X_2$ and magnet unit $255Y_2$, respectively. That is, magnet units $255X_1$ and $255X_2$ are arranged spaced in the X-axis direction, with the space equal to or more than each width (the dimension in the X-axis direction) of a plurality of armature coils 238X, and similarly, magnet units $255Y_1$ and $255Y_2$ are arranged spaced in the X-axis direction, with the space equal to or more than each length (the dimension in the X-axis direction) of a plurality of armature coils 238Y. Magnet units $255X_1$ and $255X_2$ are structured from a plurality of rectangular solid shaped magnets that are arranged so that adjacent magnetic pole surfaces in the X-axis direction have polarity different from each other and whose longitudinal direction is in the Y-axis direction. Magnet units $255Y_1$ and $255Y_2$ are structured from a plurality of rectangular solid shaped magnets that are arranged so that the adjacent magnetic pole surfaces in the Y-axis direction have polarity different from each other and whose longitudinal direction is in the X-axis direction. Further, mover 251 has an air slider (not shown), and wafer stage 264 is supported by levitation (refer to FIG. 18A) on the upper surface of base member 232, via a clearance, for example, of around 5 μm.

While, in the present embodiment, the case has been described as an example where planar motor (wafer stage mover assembly) 244W is of a 3DOF type that generates a thrust in the X, Y and θz directions, the configuration of the planar motor (wafer stage mover assembly) is not limited to this type. For example, the planar motor (wafer stage mover assembly) may be a planar motor of a 6DOF type that generates a thrust also in the Z, θx and θy directions in addition to the X, Y and θz directions. In the case of the planar motor of the 6DOF type, the thrust of the Z direction component may be configured of a combination of X component and Z component generated by using the X coils, and Y component and Z component generated by using the Y coils. Further, in the case of using the planar motor of the 6DOF type, a mover (the wafer stage) may be magnetically levitated above the base member by the thrust in the Z direction generated by the planar motor, and therefore, no air sliders are needed.

Figure 21:
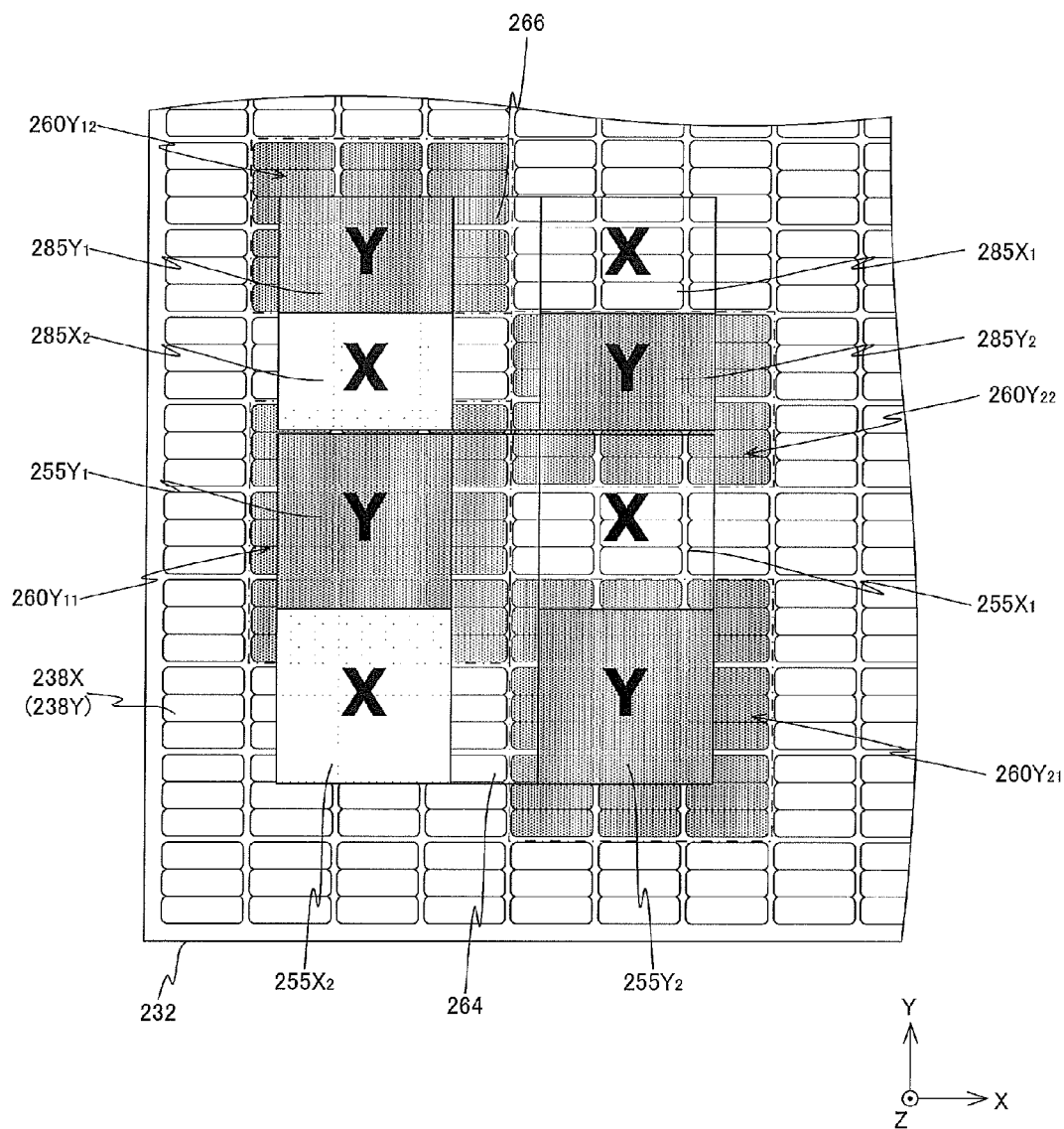
FIG. 21 is a diagrammatic representation of a positional relation between Y magnet units structuring a mover within a wafer stage and a measurement stage and armature coils (Y coil units) which are excited when both stages are proximate in accordance with an embodiment.

As illustrated in FIG. 18A, on the upper surface of base member 232 which faces mover 251, a movement plane of mover 251 is formed. Further, as it may be seen from FIGS. 17 and 18A, in an inner space of base member 232, armature coils 238X are arranged along the movement plane in the X-axis direction in a plurality of rows on the upper layer side. These armature coils 238X structure an X coil unit 260X. As armature coil 238X, a rectangular coil whose length of the longer side is three times the length of the shorter side is used. Further, armature coils 238Y are arranged along the movement plane in the Y-axis direction in a plurality of rows on the lower layer side within inner space 41. These armature coils 238Y structure a Y coil unit 260Y. (Armature coils 238Y and Y coil unit 260Y are not shown in FIG. 17. Refer to FIG. 21 and the like.) As armature coil 238Y, similar to armature coil 238X, a rectangular coil whose length of the longer side is three times the length of the shorter side is used. A stacking type stator 260 is structured by X coil unit 260X and Y coil unit 260Y that are vertically stacked. Incidentally, as previously described, examples of various modified arrangements may be employed for stacking type stator 260.

In the arrangement described above, as described earlier using FIG. 10, X coil unit 260X provides a driving force in the X-axis direction (non-scanning direction) to magnet units $255X_1$ and $255X_2$, by exciting (generating a flow of an excitation current) the plurality of armature coils 238X configuring X coil unit 260X. Similarly, Y coil unit 260Y provides a driving force in the Y-axis direction (non-scanning direction) to magnet units $255Y_1$ and $255Y_2$, by exciting (generating a flow of an excitation current) the plurality of armature coils 238Y configuring Y coil unit 260Y. This drives wafer stage 264 in a two-dimensional direction (XY directions) on base member 232.

Incidentally, as described earlier using FIG. 11, the driving force in the X-axis direction to magnet units $255Y_1$ and $255Y_2$ is not generated, even if the plurality of armature coils 238X are excited. Similarly, the driving force in the Y-axis direction to magnet units $255X_1$ and $255X_2$ is not generated, even if the plurality of armature coils 238Y are excited.

Figure 18B:
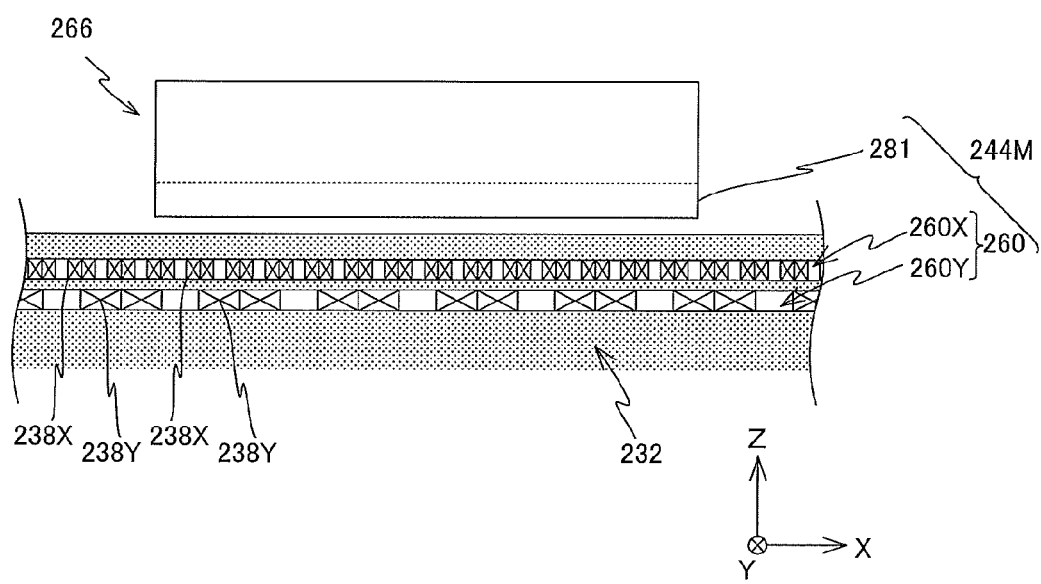
FIG. 18B is a cross section view along line B-B in FIG. 17 in accordance with an embodiment.

Next, each part structuring measurement stage 266, especially stage mover assembly 244 which drives measurement stage 266 will be described in detail. FIG. 17 shows wafer stage assembly 220, especially, a planar view of an arrangement of magnet units $285X_1$, $285X_2$, $285Y_1$, and $285Y_2$ within measurement stage 266. FIG. 18B shows a cross section view along line B-B in FIG. 17.

Measurement stage 266 includes a mover 281, the Z drive mechanism (not shown) and the like. Mover 281 is fixed to the bottom portion of measurement stage 266, and mover 281 and stator 260 structure planar motor (measurement stage mover assembly) 244M. Measurement stage mover assembly 244M and wafer stage mover assembly 244W previously described are referred to collectively as stage mover assembly 244.

Various measurement members are provided in measurement stage 266 (refer to, for example, U.S. Patent Application Publication No. 2011/0025998). As the measurement members, for example, an illuminance irregularity sensor, an aerial image measuring instrument, a wavefront aberration measuring instrument, an illuminance monitor (none of which are shown) and the like are provided.

Mover 281, as illustrated in FIG. 17, has a magnet unit $285X_1$ in a first quadrant (i.e., a portion which is half of the +X side and half of the +Y side) and a magnet unit $285X_2$ in a third quadrant (i.e., a portion which is half of the −X side and half of the −Y side), respectively. Further, mover 281 has a magnet unit $285Y_1$ in a second quadrant (i.e., a portion which is half of the −X side and half of the +Y side) and a magnet unit $285Y_2$ in a fourth quadrant (a portion which is half of the +X side and half of the −Y side), respectively. Here, space of a predetermined width is provided between magnet unit $285X_1$ and magnet unit $285Y_1$, and magnet unit $285X_2$ and magnet unit $285Y_2$, respectively. That is, magnet units $285X_1$ and 285X$_2$ are arranged spaced in the X-axis direction, with the space equal to or more than each width (the dimension in the X-axis direction) of the plurality of armature coils 238X, and similarly, magnet units 285Y$_1$ and 285Y$_2$ are arranged spaced in the X-axis direction, with the space equal to or more than each length (the dimension in the X-axis direction) of the plurality of armature coils 238Y. Magnet units 285X$_1$ and 285X$_2$ are structured from a plurality of rectangular solid shaped magnets that are arranged so that adjacent magnetic pole surfaces in the X-axis direction have polarity different from each other and whose longitudinal direction is in the Y-axis direction. Magnet units 285Y$_1$ and 285Y$_2$ are structured from a plurality of rectangular solid shaped magnets that are arranged so that adjacent magnetic pole surfaces in the Y-axis direction have polarity different from each other and whose longitudinal direction is in the X-axis direction. Further, mover 281 has an air slider (not shown), and measurement stage 266 is supported by levitation (refer to FIG. 18B) on the upper surface of base member 232, via a clearance, for example, of around 5 μm.

While, in the present embodiment, the case has been described as an example where planar motor (measurement stage mover assembly) 244M is of a 3DOF type that generates a thrust in the X, Y and θz directions, the configuration of planar motor (measurement stage mover assembly) 244M is not limited to this type, and similarly to the forgoing planar motor (wafer stage mover assembly), a planar motor of a 6DOF type may be used, for example.

In the arrangement described above, as described earlier using FIG. 10, X coil unit 260X provides a driving force in the X-axis direction to magnet units 285X$_1$ and 285X$_2$, by exciting (generating a flow of an excitation current) the plurality of armature coils 238X configuring X coil unit 260X. Similarly, Y coil unit 260Y provides a driving force in the Y-axis direction to magnet units 285Y$_1$ and 285Y$_2$, by exciting (generating a flow of an excitation current) the plurality of armature coils 238Y configuring Y coil unit 260Y. This drives measurement stage 266 in a two-dimensional direction (XY directions) on base member 232.

Incidentally, as described earlier using FIG. 11, the driving force in the X-axis direction to magnet units 285Y$_1$ and 285Y$_2$ is not generated, even if the plurality of armature coils 238X are excited. Similarly, the driving force in the Y-axis direction to magnet units 285X$_1$ and 285X$_2$ is not generated, even if the plurality of armature coils 238Y are excited.

Measurement system 222 monitors movement of reticle stage 238 (reticle R) and wafer stage 264 (wafer W) to optical assembly 216 (or some other reference). In measurement system 222, for example, laser interferometers, encoders, and the like may be used.

Environmental system 226 controls the environment in a gap between optical assembly 216 and wafer W. The gap includes a projection field in which an image of a pattern is projected. Environmental system 226 delivers and/or injects immersion fluid into the gap using spray nozzles, electrokinetic sponges, porous materials, etc. and removes the immersion fluid from the gap using vacuum pumps, sponges, and the like, which allows an immersion area Lq filled with the immersion liquid to be formed within the gap (refer, for example, to FIG. 20).

Figure 19:
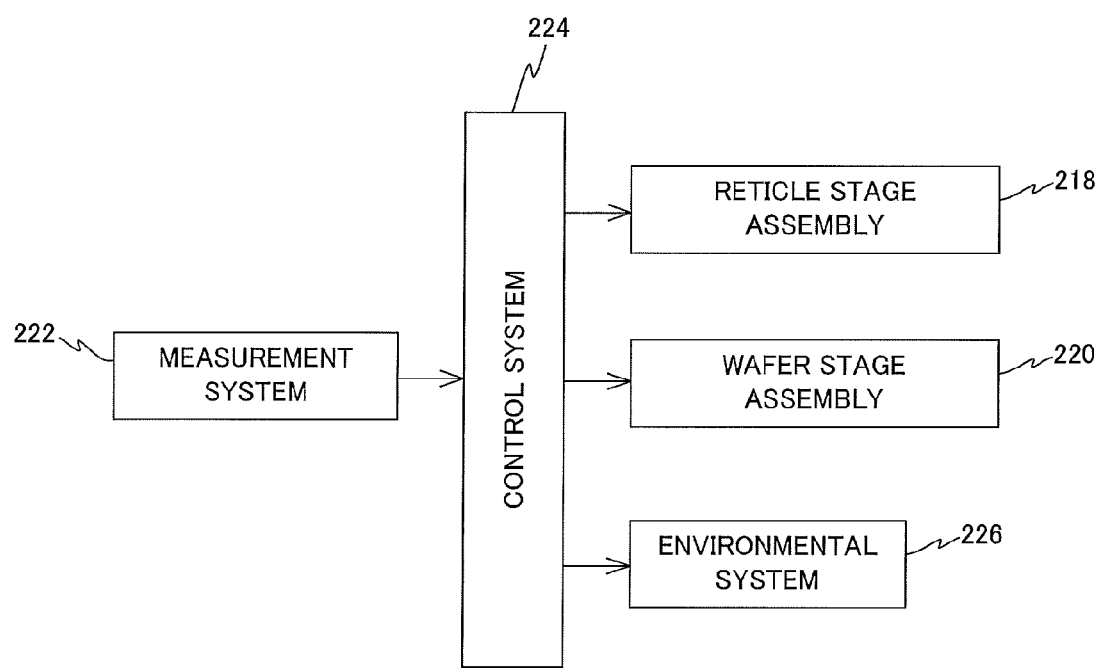
FIG. 19 is a block diagram which illustrates an input/output relation of a control system that mainly structures a control system of the exposure apparatus in FIG. 16 in accordance with an embodiment.

FIG. 19 shows a block diagram illustrating an input/output relation of control system 224 which mainly structures the control system of exposure apparatus 210, and has overall control over each part structuring the exposure apparatus. Control system 224 includes a workstation (or a microcomputer) and the like.

Control system 224 receives measurement information from measurement system 222, and drives reticle R controlling reticle stage assembly 218 and drives wafer W controlling wafer stage assembly 220 to precisely drive reticle R and wafer W simultaneously. Further, control system 224 may control the operation of environmental system 226.

Next, a scrum operation of wafer stage 264 and measurement stage 266 to move on to wafer exchange and various measurements using measurement stage 266 after scanning exposure of wafer W has been completed will be described.

Figure 20A:
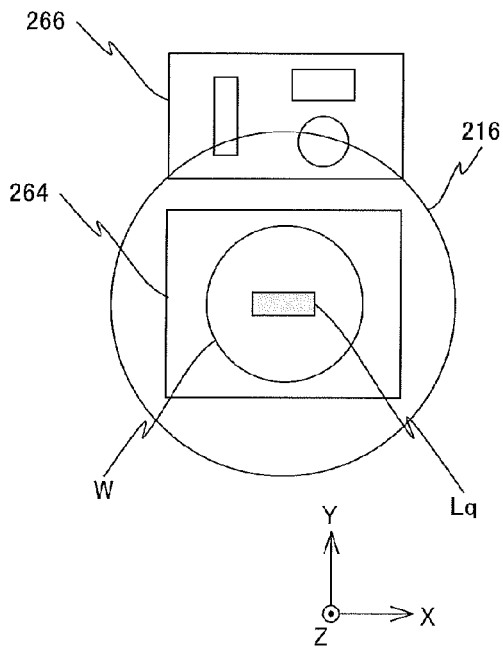
FIGS. 20A to 20D are a series of diagrammatic representations used to describe a scrum operation between a wafer stage and a measurement stage in accordance with an embodiment.

FIG. 20A shows wafer stage 264 and measurement stage 266 when scanning exposure of wafer W has been completed. At this point, wafer W (wafer stage 264) is positioned directly below optical assembly 216. That is, immersion area Lq is positioned on wafer W (wafer stage 264). Measurement stage 266 is positioned near wafer stage 264.

Figure 20B:
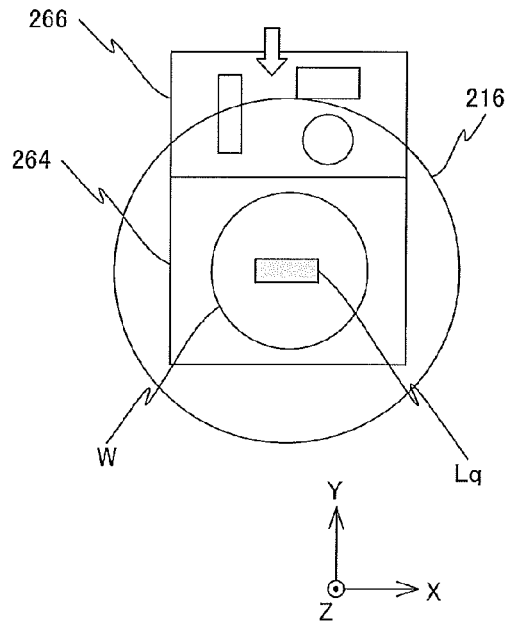

When the scanning exposure has been completed, control system 224 drives measurement stage 266 in a direction (−Y direction) indicated by an outlined arrow as illustrated in FIG. 20B, and moves the −Y edge portion of measurement stage 266 close to the +Y edge portion of wafer stage 264 via a slight gap (e.g., 0.1 to 1.0 mm). This structures a surface with the surface of wafer stage 264 and the surface of measurement stage 266 that is flush with the surface of wafer W and appears to be completely flat.

Figure 20C:
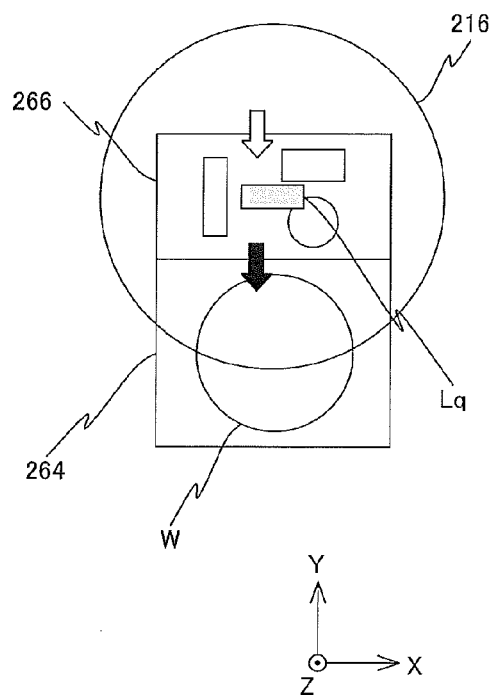

After wafer stage 264 and measurement stage 266 are in close proximity, control system 224 drives wafer stage 264 and measurement stage 266 in the −Y direction while maintaining the state in close proximity, as illustrated in FIG. 20C. FIG. 20C shows a state where wafer stage 264 is driven in a direction (−Y direction) indicated by a black arrow, and measurement stage 266 is driven in a direction (−Y direction) indicated by an outlined arrow. By this operation, wafer stage 264 withdraws from right below optical assembly 216, and instead measurement stage 266 is arranged directly below optical assembly 216. Because both of the stages 264 and 266 are in close proximity via a slight gap at this point, the immersion liquid which forms immersion area Lq does not leak from both stages, and immersion area Lq moves from above wafer stage 264 to above measurement stage 266.

Here, when wafer stage 264 and measurement stage 266 are in close proximity and both stages are driven while maintaining the close proximity state, in the embodiment, both stages are made to be in close proximity so that a driving force is generated only between each of the plurality of armature coils 238Y within stator 260 and either one of magnet units 255Y$_1$ and 255Y$_2$ within wafer stage 264 (mover 251) or magnet units 285Y$_1$ and 285Y$_2$ within measurement stage 266 (mover 281), and a driving force is generated only between each of the plurality of armature coils 238X within stator 260 and either one of magnet units 255X$_1$ and 255X$_2$ within wafer stage 26 or magnet units 285X$_1$ and 285X$_2$ within measurement stage 266. That is, both stages are made to be in close proximity in a state where magnet units 255Y$_1$ and 255Y$_2$ within wafer stage 264 are to be provided apart from magnet units 285Y$_1$ and 285Y$_2$ within measurement stage 266 in either the X-axis direction or the Y-axis direction by a distance equal to or more than each width of the plurality of armature coils 238Y, and magnet units 255X$_1$ and 255X$_2$ within wafer stage 264 are to be provided apart from magnet units 285X$_1$ and 285X$_2$ within measurement stage 266 in either the X-axis direction or the Y-axis direction by a distance equal to or more than each width of the plurality of armature coils 238X.

To be more specific, according to the symmetrical arrangement of the magnet units of wafer stage 264 and measurement stage 266, as illustrated in FIG. 21, the center in the X-axis direction is made to coincide for both stages and the +Y edge portion of wafer stage 264 is made to be in close proximity with the −Y edge portion of measurement stage 266. This makes magnet unit $255X_1$ within wafer stage 264 proximate with magnet unit $285Y_2$ within measurement stage 266, and magnet unit $255Y_1$ within wafer stage 264 proximate with magnet unit $285X_2$ within measurement stage 266. At this point, magnet units $255Y_1$ and $255Y_2$ within wafer stage 264 face armature coil 238Y within areas $260Y_{11}$ and $260Y_{21}$, respectively, and magnet units $285Y_1$ and $285Y_2$ within measurement stage 266 face armature coil 238Y within areas $260Y_{12}$ and $260Y_{22}$, respectively. Here, areas $260Y_{11}$, $260Y_{21}$, $260Y_{12}$, and $260Y_{22}$ do not overlap one another. That is, magnet units $255Y_1$ and $255Y_2$, and $285Y_1$ and $285Y_2$ each always face a different armature coil 238Y. Accordingly, from each of the plurality of armature coils 238Y, a driving force is generated only between either magnet units $255Y_1$ and $255Y_2$ within wafer stage 264 or magnet units $285Y_1$ and $285Y_2$ within measurement stage 266.

Incidentally, while in the description above the +Y edge portion of wafer stage 264 and the −Y edge portion of measurement stage 266 are made to be in close proximity by making the centers in the X-axis direction of both the stages coincide with each other, this is not intended to be limiting. More specifically, the +Y edge portion of wafer stage 264 and the −Y edge portion of measurement stage 266 may be made to be in close proximity by making the centers in the X-axis direction of both the stages shifted in the X-axis direction in a range that satisfies the above-described conditions, for example, a range where magnet unit $285Y_2$ and magnet unit $255Y_1$ do not face each other.

Figure 22:
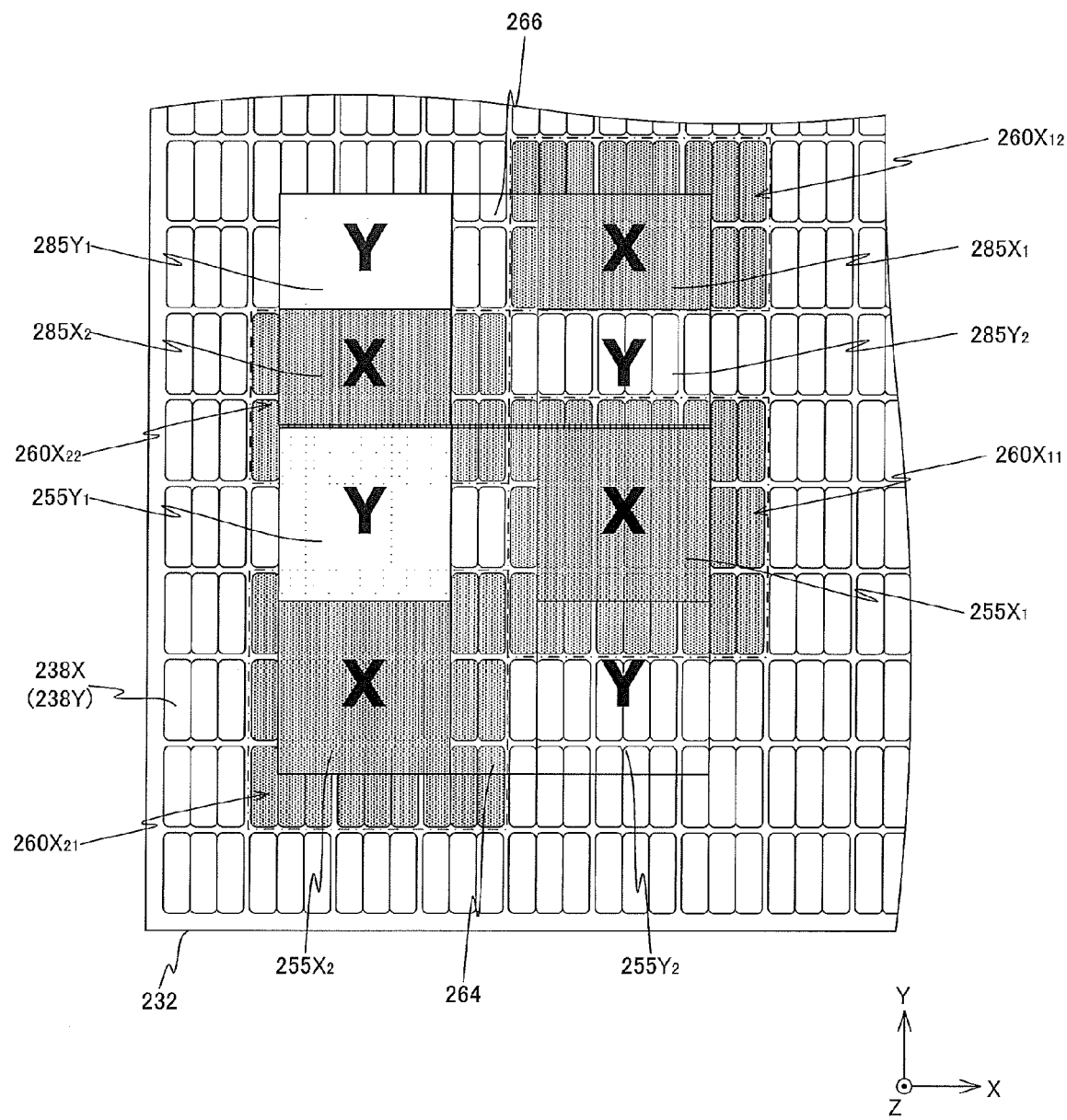
FIG. 22 is a diagrammatic representation when a wafer stage and a measurement stage are proximate, of a positional relation between X magnet units structuring a mover within both stages and armature coils (X coil units) which are excited in accordance with an embodiment.

Similarly, as illustrated in FIG. 22, magnet units $255X_1$ and $255X_2$ within wafer stage 264 face armature coil 238X within areas $260X_{11}$ and $260X_{21}$, respectively, and magnet units $285X_1$ and $285X_2$ within measurement stage 266 face armature coil 238X within areas $260X_{12}$ and $260X_{22}$, respectively. Here, areas $260X_{11}$, $260X_{21}$, $260X_{12}$, and $260X_{22}$ do not overlap one another. That is, magnet units $255X_1$ and $255X_2$, and $285X_1$ and $285X_2$ each always face a different armature coil 238X. Accordingly, from each of the plurality of armature coils 238X, a driving force is generated only between either magnet units $255X_1$ and $255X_2$ within wafer stage 264 or magnet units $285X_1$ and $285X_2$ within measurement stage 266.

Incidentally, as previously described, the driving force is not generated in each magnet unit even if magnet units $255Y_1$ and $255Y_2$, and $285Y_1$ and $285Y_2$ face armature coil 238X, and the driving force is not generated in each magnet unit even if magnet unit $255X_1$ and $255X_2$, and $285X_1$ and $285X_2$ face armature coil 238Y.

Accordingly, as described earlier using FIGS. 3A to 3C, even in the case when wafer stage 264 is in close proximity with measurement stage 266 as in the scrum operation described above, by exciting each of the plurality of armature coils 238X and 238Y within stator 260, drive control of both stages may be performed independently.

Figure 20D:
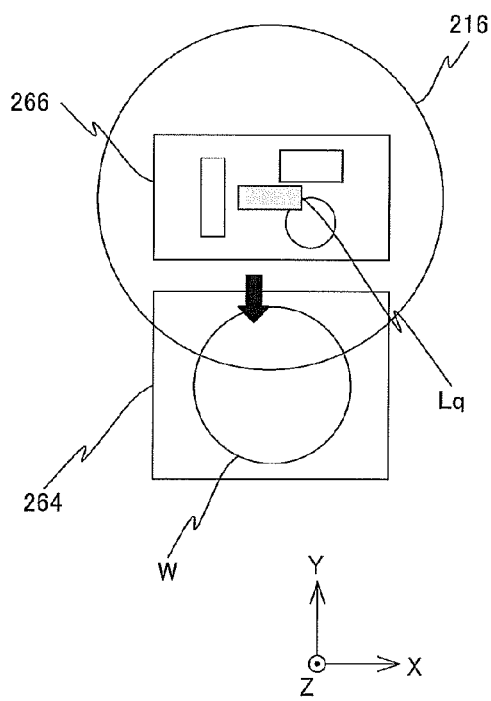

After immersion area Lq has been moved, control system 224 drives only wafer stage 264 in a direction (−Y direction) indicated by a black arrow while measurement stage 266 is still positioned directly below optical assembly 216, as illustrated in FIG. 20D. Wafer stage 264 is moved to a wafer exchange area (not shown), and wafer W which has been exposed is exchanged to a new wafer. Concurrently with this operation, various measurements such as the aerial image measurement and the like is performed using measurement stage 266 positioned directly below optical assembly 216, in a state where immersion area Lq is maintained above measurement stage 266.

After the wafer exchange and the various measurements have been completed, control system 224 performs a reversed operation of the scrum operation described above, and withdraws measurement stage 266 from directly below optical assembly 216, and positions wafer stage 264 directly under optical assembly 216 instead. By this operation, immersion area Lq is moved from above measurement stage 266 to above wafer stage 264 (the new wafer). After immersion area Lq has been moved, wafer alignment and scanning exposure are performed on the new wafer.

Incidentally, in the embodiment described above, while the arrangement where the same type of magnet units are provided spaced apart in the X-axis direction was employed for magnet units $255X_1$ and $255X_2$, and $255Y_1$ and $255Y_2$ within wafer stage 264 (mover 251), an arrangement where the same type of magnet units are provided spaced apart in the Y-axis direction may also be employed. In general, any suitable arrangement may be employed such as the arrangement illustrated in FIG. 3A, FIG. 4, FIG. 6A to FIG. 6D, FIG. 14, FIG. 15 or the like, as long as the same type of magnet units are arranged spaced apart by a distance equal to or more than the width of the corresponding armature coils 238X and 238Y. In such a case, because the same type of magnets facing a single armature coil 238X or 238Y is two or less, drive control of both stages may be performed independently.

Further, while the arrangement of placing two each of the same type of magnet units $255X_1$ and $255X_2$, and $255Y_1$ and $255Y_2$ in wafer stage 264 was employed, an arrangement of placing one X magnet unit and one Y magnet unit may also be employed. Similarly, while the arrangement of placing two each of the same type of magnet units $285X_1$ and $285X_2$, and $285Y_1$ and $285Y_2$ in measurement stage 266 was employed, an arrangement of placing one X magnet unit and one Y magnet unit may also be employed. Even in such a case, wafer stage 264 and measurement stage 266 may be driven in the XY two-dimensional direction.

Further, instead of stacking type stator 260 described above in the embodiment, in the inner space of base member 232, stator (planar motor coil array) 1420 may be used whose X coil unit (X coil group) 1420b and Y coil unit (Y coil group) 1420a are alternately arranged in the X-axis direction and the Y-axis direction as illustrated in FIG. 14. However, X coil unit 1420b (Y coil unit 1420a) is structured as one rectangular shaped coil unit having four sides whose length is equal to one another, with three coils that are armature coils 238X (238Y) whose longitudinal direction is in the Y-axis direction (X-axis direction) and is arranged in the X-axis direction (Y-axis direction).

Further, in the embodiment described above, the case has been described where in the scrum operation of wafer stage 264 and measurement stage 266, that is, in the case when wafer stage 264 and measurement stage 266 are in close proximity in the Y-axis direction and both stages are driven in the direction in close proximity while maintaining the proximity state, drive control of both stages may be performed independently. However, also in the case when both stages are driven in a direction intersecting the direction in close proximity while maintaining the proximity state, i.e., in the X-axis direction, or in the case when both stages are in close proximity in the X-axis direction, and both stages are driven in the direction in close proximity or in the direction intersecting the direction in close proximity, magnet units $255Y_1$ and $255Y_2$, and $285Y_1$ and $285Y_2$ each face a different armature coil 238Y, and magnet units $255X_1$ and $255X_2$, and $285X_1$ and 285X$_2$ each face a different armature coil 238X, which allows drive control of both stages to be performed independently.

Figure 8:
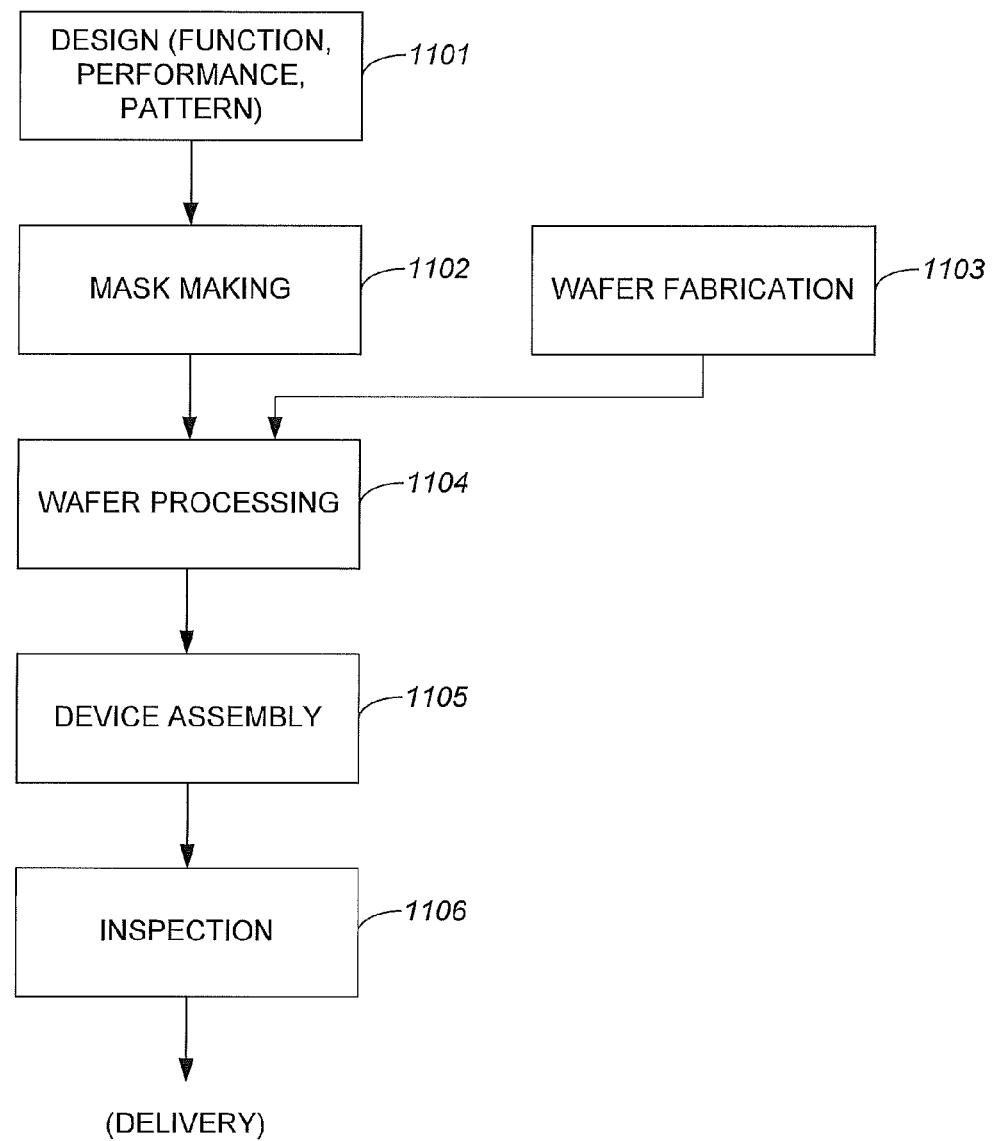
FIG. 8 is a process flow diagram which illustrates the steps associated with fabricating a semiconductor device in accordance with an embodiment of the present invention.

FIG. 8 is a process flow diagram which illustrates the steps associated with fabricating a semiconductor device in accordance with an embodiment of the present invention. A process of fabricating a semiconductor device begins at step 1101 in which the function and performance characteristics of a semiconductor device are designed or otherwise determined. Next, in step 1102, a reticle or mask in which has a pattern is designed based upon the design of the semiconductor device. It should be appreciated that in a substantially parallel step 1103, a wafer is typically made from a silicon material. In step 1104, the mask pattern designed in step 1102 is exposed onto the wafer fabricated in step 1103 through the use of a lithography system. One process of exposing a mask pattern onto a wafer will be described below with respect to FIG. 9. In step 1105, the semiconductor device is assembled. The assembly of the semiconductor device generally includes, but is not limited to including, wafer dicing processes, bonding processes, and packaging processes. Finally, the completed device is inspected in step 1106. Upon successful completion of the inspection in step 1106, the completed device may be considered to be ready for delivery.

Figure 9:
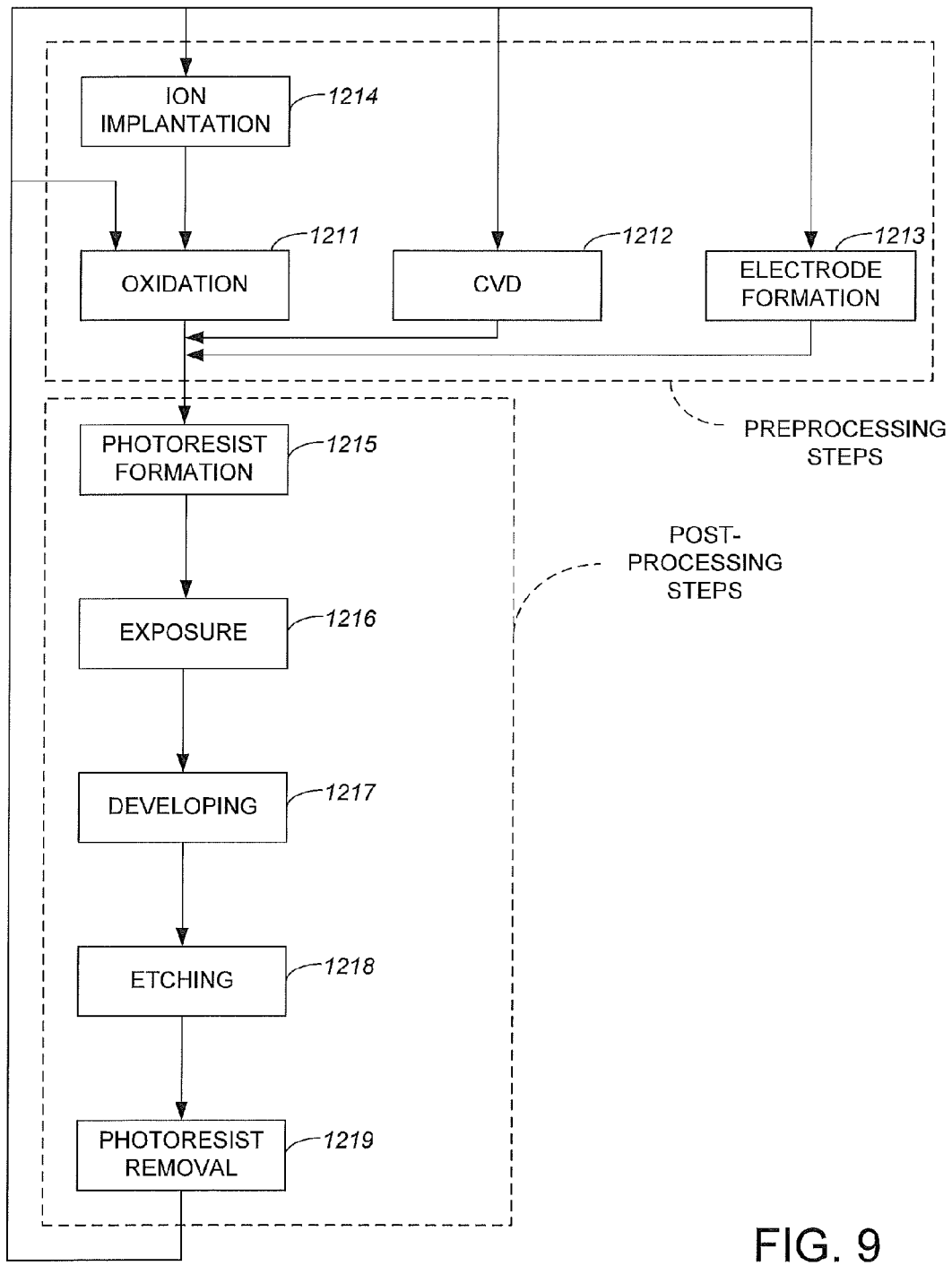
FIG. 9 is a process flow diagram which illustrates the steps associated with processing a wafer, i.e., step 1104 of FIG. 8, in accordance with an embodiment of the present invention.

FIG. 9 is a process flow diagram which illustrates the steps associated with wafer processing in the case of fabricating semiconductor devices in accordance with an embodiment of the present invention. In step 1211, the surface of a wafer is oxidized. In step 1212 which is a chemical vapor deposition (CVD) step in one embodiment, an insulation film may be formed on the wafer surface. In step 1213, electrodes are formed on the wafer by vapor deposition. Ions may be implanted in the wafer using substantially any suitable method in step 1214. As will be appreciated by those skilled in the art, steps 1211-1214 are generally considered to be preprocessing steps for wafers during wafer processing. These preprocessing steps may be sequential or performed individually. Further, it should be understood that selections made in each step, e.g., the concentration of various chemicals to use in forming an insulation film in step 1212, may be made based upon processing requirements.

At each stage of wafer processing, when preprocessing steps have been completed, post-processing steps may be implemented. During post-processing, initially, in step 1215, photoresist is applied to a wafer. Then, in step 1216, an exposure device may be used to transfer the circuit pattern of a reticle to a wafer.

After the circuit pattern on a reticle is transferred to a wafer, the exposed wafer is developed in step 1217. Once the exposed wafer is developed, parts other than residual photoresist, e.g., the exposed material surface, may be removed by etching in step 1218. Finally, in step 1219, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, a magnet array has been described as being substantially coupled to a stage and separated from a stator comprising a coil array. The stator, which may include a stacked coil arrangement, is generally coupled to a ground or a counter mass. In lieu of a magnet array being coupled to a stage while a coil array is coupled to a ground or a counter mass, the magnet array may be coupled to a ground or a counter mass while a coil array is coupled to a stage.

While the use of a motor described above has generally been described as being suitable for use in a lithography system such as an immersion lithography system, the motor described above is not limited to being used in an immersion lithography system. In other words, a planar motor that utilizes a magnet array in which quadrants are spaced apart in at least one direction and/or a stator that includes a stacked coil arrangement may be used in any suitable system.

Alternating of coils pairings of a stacked coil arrangement have been described as including coil pairings in which an X coil is positioned on top of a Y coil are alternated with coil pairings in which a Y coil is positioned on top of an X coil. It should be appreciated that in lieu of alternating coil pairings, a stacked coil arrangement may be configured such that the stacked coil arrangement effectively includes one or more first areas in which X coils are positioned on top of Y coils and one or more second areas in which Y coils are positioned on top of X coils.

It should be appreciated that it may be beneficial to include a space between quadrants of magnets, e.g., space "w" shown in FIG. 3A, even in a system that includes substantially only one stage. Such a space "w" utilized in a system that includes substantially only one stage may ensure that there is no coil that overlaps the two X or the two Y quadrants on a single stage, thereby facilitating the accurate control of stage motion.

The operations associated with the various methods of the present invention may vary widely. Steps may be added, removed, altered, combined, and reordered without departing from the spirit or the scope of the present invention.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

The invention claimed is:

1. A stage apparatus comprising:
a first stage;
a first magnet array, the first magnet array being associated with the first stage; and
a stator arrangement, the stator arrangement being arranged to cooperate with the first magnet array to drive the first stage, wherein the stator arrangement includes a plurality of coils, the plurality of coils including a first coil of a first type, a second coil of a second type, a third coil of the first type, and a fourth coil of the second type, the first coil and the fourth coil being in a first plane, the second coil and the third coil being in a second plane, wherein the first coil is stacked over the second coil and the fourth coil is stacked over the third coil, wherein the first coil and the third coil are arranged to provide a force in a first direction along a first axis, and the second coil and the fourth coil are arranged to provide a force in a second direction along a second axis.

2. The stage apparatus of claim 1 wherein the first coil is stacked over the second coil relative to a third axis, the third axis being crossed to the first axis and the second axis.

3. The stage apparatus of claim 2 wherein the first magnet array includes at least a first quadrant and a second quadrant, the first quadrant and the second quadrant having a space there between such that the first quadrant is spaced apart from the second quadrant by a distance along the first axis.

4. The stage apparatus of claim 3 wherein the first coil has a first coil length, and the distance is greater than or approximately equal to the first coil length.

5. The stage apparatus of claim 3 wherein the first quadrant includes a first magnet and the second quadrant includes a second magnet, the first magnet being arranged to cooperate with the stator arrangement to generate the force in the first direction, the second magnet being arranged to cooperate with the stator arrangement to generate the force in the second direction.

6. The stage apparatus of claim 5 wherein the first quadrant is further arranged to cooperate with the stator arrangement to generate a first force along the third axis.

7. The stage apparatus of claim 6 wherein the second quadrant is further arranged to cooperate with the stator arrangement to generate a second force along the third axis.

8. The stage apparatus of claim 3 wherein the first quadrant includes a first magnet and the second quadrant includes a second magnet, wherein both the first and second magnets are arranged to cooperate with the stator arrangement to generate the force in the first direction.

9. The stage apparatus of claim 1 further including:
a second stage; and
a second magnet array, the second magnet array being associated with the second stage, wherein the second magnet array is arranged to cooperate with the stator arrangement to drive the second stage.

10. The stage apparatus of claim 9 wherein a first portion of the first magnet array is periodically positioned near a second portion of the second magnet array, the first portion of the first magnet array being arranged to cooperate with the stator arrangement to generate a first force on the first stage along a first axis, the second portion of the second magnet array being arranged to cooperate with the stator arrangement to generate a second force on the first stage along a second axis.

11. An exposure apparatus comprising the stage apparatus of claim 1.

12. A wafer formed using the exposure apparatus of claim 11.

* * * * *

UNITED STATES PATENT AND TRADEMARK OFFICE
CERTIFICATE OF CORRECTION

Page 1 of 1

PATENT NO.       : 9,030,057 B2
APPLICATION NO.  : 13/526994
DATED            : May 12, 2015
INVENTOR(S)      : Michael B. Binnard and Pai-Hsueh Yang It is certified that error appears in the above-identified patent and that said Letters Patent is hereby corrected as shown below:

In Title Page, item (75), "Binnad" should be -- Binnard --.

Signed and Sealed this
Twenty-fourth Day of November, 2015

Michelle K. Lee
*Director of the United States Patent and Trademark Office*

UNITED STATES PATENT AND TRADEMARK OFFICE
CERTIFICATE OF CORRECTION

| | | |
|---|---|---|
| PATENT NO. | : 9,030,057 B2 | Page 1 of 1 |
| APPLICATION NO. | : 13/526994 | |
| DATED | : May 12, 2015 | |
| INVENTOR(S) | : Michael B. Binnard and Pai-Hsueh Yang | |

It is certified that error appears in the above-identified patent and that said Letters Patent is hereby corrected as shown below:

In Title Page, items (12) and (75), "Binnad" should be -- Binnard --.

This certificate supersedes the Certificate of Correction issued November 2, 2015.

Signed and Sealed this
Fifth Day of January, 2016

Michelle K. Lee
*Director of the United States Patent and Trademark Office*